(12) United States Patent
Kawahara et al.

(10) Patent No.: US 6,511,620 B1
(45) Date of Patent: Jan. 28, 2003

(54) METHOD OF PRODUCING SEMICONDUCTOR DEVICES HAVING EASY SEPARABILITY FROM A METAL MOLD AFTER MOLDING

(75) Inventors: Toshimi Kawahara, Kawasaki (JP); Hirohisa Matsuki, Kawasaki (JP); Yasuhiro Shinma, Kawasaki (JP); Yoshiyuki Yoneda, Kawasaki (JP); Norio Fukasawa, Kawasaki (JP); Yuzo Hamanaka, Kawasaki (JP); Kenichi Nagashige, Kawasaki (JP); Takashi Hozumi, Kasugai (JP)

(73) Assignees: Fujitsu Limited, Kawasaki (JP); Fujitsu Automation Limited, Kawasaki (JP)

( * ) Notice: Subject to any disclaimer, the term of this patent is extended or adjusted under 35 U.S.C. 154(b) by 0 days.

(21) Appl. No.: 09/511,496

(22) Filed: Feb. 23, 2000

(30) Foreign Application Priority Data

Jun. 25, 1999 (JP) ............................................. 11-180258

(51) Int. Cl.[7] .......................... B29C 33/18; B29C 33/68; B29C 43/28
(52) U.S. Cl. ................. 264/40.5; 364/511; 364/272.14; 364/272.15; 364/272.17; 364/276; 425/121; 425/141
(58) Field of Search .............................. 264/40.1, 40.5, 264/511, 272.14, 272.15, 272.17, 276, 319, 328.4, 328.5; 425/116, 121, 129.1, 140, 141, 544, 546

(56) References Cited

U.S. PATENT DOCUMENTS

| | | | | |
|---|---|---|---|---|
| H1654 H | * | 6/1997 | Rounds | 264/511 |
| 5,674,343 A | * | 10/1997 | Hotta et al. | 156/245 |
| 5,824,252 A | * | 10/1998 | Miyajima | 264/272.17 |
| 5,846,477 A | * | 12/1998 | Hotta et al. | 264/511 |
| 5,891,377 A | * | 4/1999 | Libres et al. | 264/2.14 |
| 5,891,384 A | * | 4/1999 | Miyajima et al. | 264/276 |
| 6,048,483 A | * | 4/2000 | Miyajima | 425/544 |
| 6,080,354 A | * | 6/2000 | Miyajima | 264/328.4 |
| 6,258,314 B1 | * | 7/2001 | Oida et al. | 264/272.15 |
| 6,261,501 B1 | * | 7/2001 | Miyagawa et al. | 264/272.15 |
| 6,344,162 B1 | * | 2/2002 | Miyajima | 425/89 |

FOREIGN PATENT DOCUMENTS

JP          9-117931          5/1997

* cited by examiner

*Primary Examiner*—Angela Ortiz
(74) *Attorney, Agent, or Firm*—Armstrong, Westerman & Hattori, LLP

(57) ABSTRACT

A method of producing semiconductor devices which have an excellent separability from a metal mold after resin encapsulation and thus eliminates the need to clean the metal mold. A metal mold for producing such semiconductor devices is also provided. According to the method of the present invention, the metal mold is first opened, and two separation sheets are disposed on dividing surfaces including cavity forming surfaces of a first metal mold and a second metal mold. A substrate is then placed on one of the separation sheets, with its semiconductor chip formed surface facing the second metal mold. An encapsulation resin is provided on the substrate placed on one of the separation sheets. The metal mold in a heated state is closed and pressed to form a resin layer for encapsulating electrodes formed on the substrate. The metal mold is again opened, and the resin-encapsulated substrate is taken out of the metal mold. After the separation sheets are removed, the substrate is divided into individual semiconductor devices.

7 Claims, 31 Drawing Sheets

348

356   346

348

METHOD OF PRODUCING SEMICONDUCTOR DEVICES HAVING EASY SEPARABILITY FROM A METAL MOLD AFTER MOLDING

BACKGROUND OF THE INVENTION

1. Field of the Invention

The present invention generally relates to semiconductor production methods and metal molds for producing semiconductor devices, and, more particularly, to a method of producing semiconductor devices each having a chip-size package structure and a metal mold for producing such semiconductor devices.

In recent years, there has been an increasing demand for smaller electronic equipment. In response to such a demand, semiconductor devices have been becoming smaller with higher densities. Such semiconductor devices include a chip size package type (hereinafter referred to as "CSP") of a size as close as possible to a semiconductor chip. A semiconductor device of the CSP type is partially provided with resin to improve its reliability while maintaining its smallness. Meanwhile, there is also a demand for semiconductor devices which can be manufactured at high efficiency. To satisfy the two demands, it is necessary to improve productivity and efficiency in the process of providing the resin for a semiconductor device of the CSP type.

2. Description of the Related Art

FIG. 1A shows a CSP-type semiconductor device 1. As shown in this figure, the semiconductor device 1 comprises a semiconductor chip 2, a resin layer 3, and electrodes 4. The resin layer 3 has a predetermined thickness and is formed on a circuit-formation surface having the electrodes 4 of the semiconductor chip 2, so that the circuit-formation surface of the semiconductor chip 2 can be protected by the resin layer 3. The resin layer 3 also, encapsulates the electrodes 4 except the top ends of the electrodes 4 (that are used for electric connection). By encapsulating the electrodes 4, the resin layer 3 also strengthens the attaching of the electrodes 4 to the semiconductor chip 2. The top ends of the electrodes 4 are attached to electrode pads 6 of a printed circuit board 5, thereby mounting the semiconductor device 1 on the printed circuit board 5.

Japanese Laid-Open Patent Application No. 10-71944 discloses a method of forming the resin layer 4 and a metal mold for producing semiconductor devices employed in the method. FIG. 2 shows a metal mold 20 for producing semiconductor devices. The metal mold 20 can be divided into an upper mold 21 and a lower mold 22. The upper mold 21 and the lower mold 22 each have a heater inside (not shown) to heat and melt an encapsulation resin 35 mentioned later. The upper mold 21 moves up and down in directions indicated by arrows Z1 and Z2 in FIG. 2. The lower surface of the upper mold 21 serves as a cavity surface 21a that is almost flat. Accordingly, the upper mold 21 has a very simple shape, and can be produced at a low cost.

Meanwhile, the lower mold 22 is made up of a first sub lower mold 23 and a second sub lower mold 24. The first sub lower mold 23 has a shape corresponding to the shape of a substrate 16, and more specifically, the first sub lower mold 23 has a diameter slightly larger than the diameter of the substrate 16. The substrate 16 is mounted on a cavity surface 25 formed on the upper surface of the first sub lower mold 23. Also, a cavity surface 26 is formed on the side surface of the second sub lower mold 24. In this example, the first sub lower mold 23 is fixed.

The second sub lower mold 24 has an annular shape, surrounding the first sub lower mold 23. The second sub lower mold 24 moves up and down in the directions of the arrows Z1 and Z2 with respect to the first sub lower mold 23.

Immediately after the start of the resin encapsulation process, the second sub lower mold 24 is in a higher state in the direction of the arrow Z2 with respect to the first sub lower mold 23, so that the substrate 16 is mounted in a cavity portion formed by the first and second sub lower molds 23 and 24. Here, the surface of the substrate 17, on which the bumps 12 are provided, faces upward, so that the bumps 12 face the upper mold 21 in the substrate-mounted state.

After the mounting of the substrate 16 in the lower mold 22, a film sheet 30 is attached only to the lower surface of the upper mold 21, and the encapsulation resin 35 is placed on the bumps 12 on the substrate 16. FIG. 3 shows the encapsulation resin 35 placed on a semiconductor chip 11.

The above substrate mounting process is followed by a resin layer forming process. In the resin layer forming process, the metal mold 20 heated to a temperature high enough to melt the encapsulation resin 35, and the upper mold 21 is then moved down in the direction of the arrow Z1.

By moving the upper mold 21 in the direction of the arrow Z1, the upper 21 is first brought into contact with the upper surface of the second sub lower mold 24. Since the lower surface of the upper mold 21 is covered with the film sheet 30 as described above, the film sheet 30 is clamped between the upper mold 21 and the second sub lower mold 24, with the upper mold 21 being in contact with the second sub lower mold 24, as shown in FIG. 4. At this point, a cavity 28 surrounded by the cavity surfaces 21a, 25, and 26 is formed inside the metal mold 20.

Since the encapsulation resin 35 is pressed by the descending upper mold 21 via the film sheet 30 and is heated to a melting temperature, the encapsulation resin 35 can be spread on the substrate 16 to some extent, as shown in FIG. 4.

Once the upper mold 21 is brought into contact with the second sub lower mold 24, the upper mold 21 and the second sub lower mold 24 move further down in the direction of the arrow Z1, with the film sheet 30 being in the clamed state. On the other hand, the first sub lower mold 23 remains in the fixed state. As a result, the cavity 28 becomes smaller as the upper mold 2 and the second sub lower mold 24 move downward, and hence the encapsulation resin 35 is compressed and molded inside the cavity 28. This resin molding technique is called compression mold technique.

FIG. 5 shows a state after the resin layer forming process. In this state, the film sheet 30 is pressed onto the substrate so hard that the top ends of the bumps 12 are lodged in the film sheet 30. Also, the encapsulation resin 35 is spread on the entire surface of the substrate 16, thereby forming a resin layer 13 which encapsulates the bumps 12.

The above resin layer forming process is followed by a separation process. In this process, the upper mold 21 is first moved up in the direction of the arrow Z2. Since the resin layer 13 adheres to the cavity surface 26 of the second sub lower mold 24, only the upper mold 12 is moved upward and separated from the film sheet 30.

The second sub lower mold 24 is then moved down in the direction of Z1 with respect to the first sub lower mold 23. In FIG. 6, the left half defined by a vertical center line shows the state in which the upper mold 21 has been moved up and the second sub lower mold 24 has been moved down. By moving the second sub lower mold 24 downward with respect to the first sub lower mold 23, the resin layer 13 can be separated from the cavity surface 26 of the second sub lower mold 24.

As the resin layer 13 and the cavity surface 26 are separated, the second sub lower-mold 24 starts moving up in the direction of the arrow X2. By doing so, the upper surface of the second low sub mold 24 is brought into contact with the film sheet 30, and the cavity surface 26 is brought into contact with the side face of the resin layer 13. As a result, the substrate 16 is moved upward. Since the film sheet 30 and the resin layer 13 adhere to each other, the substrate 16 is separated from the first sub lower mold 23 when the film sheet 30 is moved upward. The substrate 16 with the resin layer 13 is thus separated from the metal mold 20, as shown in the right half defined by the center line in FIG. 6.

As described so far, the method and device disclosed in the Japanese Laid-Open Patent Application No. 10-71944 greatly reduce the amount of the encapsulation resin 35 for one semiconductor chip 11, thereby reducing the material costs. Also, the resin layer 13 can be more easily formed uniformly on the entire surface of the substrate 16 by the compression mold technique, compared with a conventional transfer mold technique by which resin is injected into a mold.

In the above device, however, only the film sheet 30 is attached to the lower surface of the upper mold 21, and it is impossible to prevent the resin from being brought into contact with the lower mold 22. This results in a poor separability from the metal mold 20 after the resin encapsulation process. Also, the film sheet 30 cannot be kept in tension, and might be wrinkled during the operation of the metal mold 20. The wrinkled film sheet 30 leads to a wrinkled molded product. Furthermore, if a void or impurities exist inside the molded resin layer 13, the reliability of the device will be decreased.

SUMMARY OF THE INVENTION

A general object of the present invention is to provide a semiconductor production method and a metal mold for producing semiconductor devices, in which the above disadvantages are eliminated.

A more specific object of the present invention is to provide a method of producing semiconductor devices which have an excellent separability from a metal mold after molding so as to almost entirely eliminate the need to clean the metal mold, and a metal mold for producing such semiconductor devices.

Another specific object of the present invention is to provide a method and a metal mold for producing semiconductor devices, by which a resin layer having a desired thickness can be formed from the same amount of encapsulation resin for various types of semiconductor devices, the resin layer surface can be prevented from surface roughening, the encapsulation resin is not spread on the reverse side of a resin layer formed surface, and the resin layer is free from voids and pinholes.

The above objects of the present invention are achieved by a method of producing semiconductor devices, comprising the steps of:

opening a dividable metal mold which comprises a first metal mold having a first cavity forming surface and a second metal mold having a second cavity forming surface, the first metal mold having a first surface facing the second metal mold while the second metal mold having a second surface facing the first metal mold;

disposing a first separation sheet on the first surface including the first cavity forming surface, and a second separation sheet on the second surface including the second cavity forming surface;

attaching the first separation sheet and the second separation sheet closely to the first cavity forming surface and the second cavity forming surface by attracting the first separation sheet and the second separation sheet through a plurality of annular suction portions formed in the dividing surfaces:

placing a substrate provided with a plurality of semiconductor chips on the first separation sheet on the first cavity forming surface;

closing the dividable metal mold so as to form a resin layer by a compression molding technique using an encapsulation resin supplied on the substrate;

opening the dividable metal mold so as to remove the substrate having the resin layer formed thereon from the dividable metal mold opened;

removing the first separation sheet and the second separation sheet from the substrate; and dividing the substrate into individual semiconductor devices.

In this method, the encapsulation resin is not brought into contact with the first and second metal molds. Accordingly, an excellent separability can be achieved. Even if the encapsulation resin enters between the substrate and the cavity forming surface of the metal mold, the substrate can be surely separated from the dividable metal mold. Also, there is substantially no need to clean the dividable metal mold. Furthermore, in a case where the first metal mold comprises a movable sub metal mold and a fixed sub metal mold, there is no risk of the encapsulation resin entering the gap portion between the movable sub metal mold and the fixed sub metal mold. Thus, wrong operations of the movable sub metal mold and damage on the sliding surface can be prevented. Also, no wrinkles are caused in the separation sheets, so that the resin layer surface of each semiconductor device can be prevented from surface roughening.

The above objects of the present invention are also achieved by a metal mold for producing semiconductor devices by a compression molding technique for resin-encapsulating a substrate provided with a plurality of semiconductor chips. This metal mold comprises: a first metal mold having a first cavity forming surface; a second metal mold having a second cavity forming surface; a plurality of annular suction grooves formed in the dividing surfaces including the first and second cavity forming surfaces; and a vacuum source provided in channels communicating with the suction grooves. The first and second separation sheets are attracted toward the first and second cavity forming surfaces by the vacuum source via the suction grooves.

With this structure, the encapsulation resin does not touch the first and second metal molds. Accordingly, an excellent separability can be achieved. Even if the encapsulation resin enters between the substrate and the cavity forming surface of the metal mold, the substrate can be surely separated from the dividable metal mold. Also, there is substantially no need to clean the dividable metal mold. Furthermore, in a case where the first metal mold comprises a movable sub metal mold and a fixed sub metal mold, there is no risk of the encapsulation resin entering the gap portion between the movable sub metal mold and the fixed sub metal mold. Thus, wrong operations of the movable sub metal mold and damage on the sliding surface can be prevented. Also, no wrinkles are caused in the separation sheets, so that the resin layer surface of each semiconductor device after the molding process can be prevented from surface roughening.

The above and other objects and features of the present invention will become more apparent from the following description taken in conjunction with the accompanying drawings.

DESCRIPTION OF THE PREFERRED EMBODIMENTS

Figure 1A:
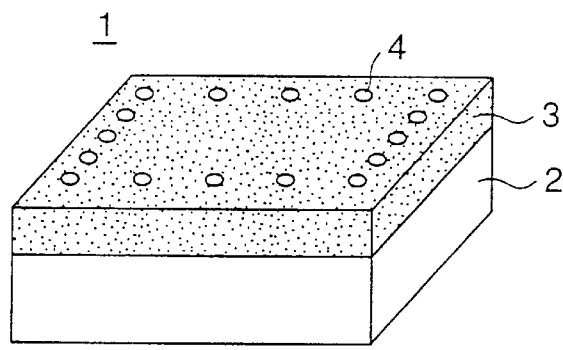
FIG. 1A shows a conventional semiconductor device provided with electrodes encapsulated with resin.
Figure 1B:
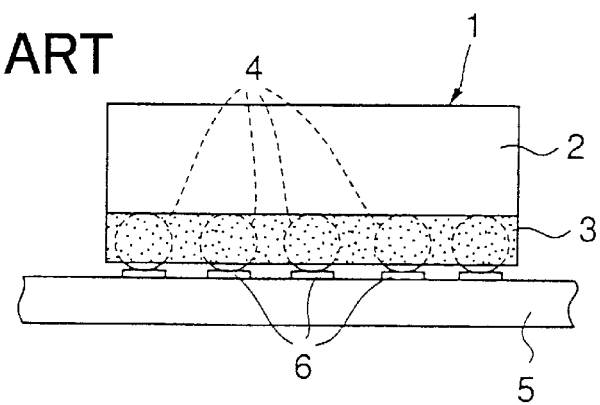
FIG. 1B shows the semiconductor device mounted on a printed circuit board.
Figure 2:
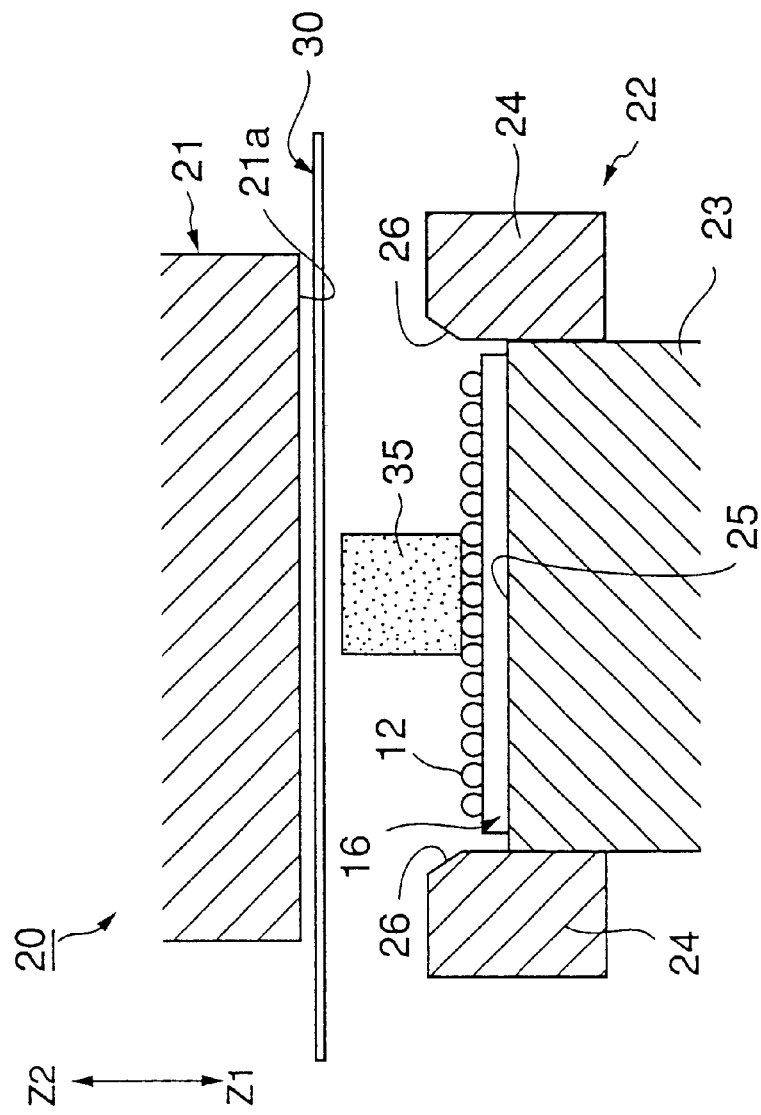
FIG. 2 shows a conventional metal mold provided with a substrate and an encapsulation resin in accordance with a conventional method of producing semiconductor devices.
Figure 3:
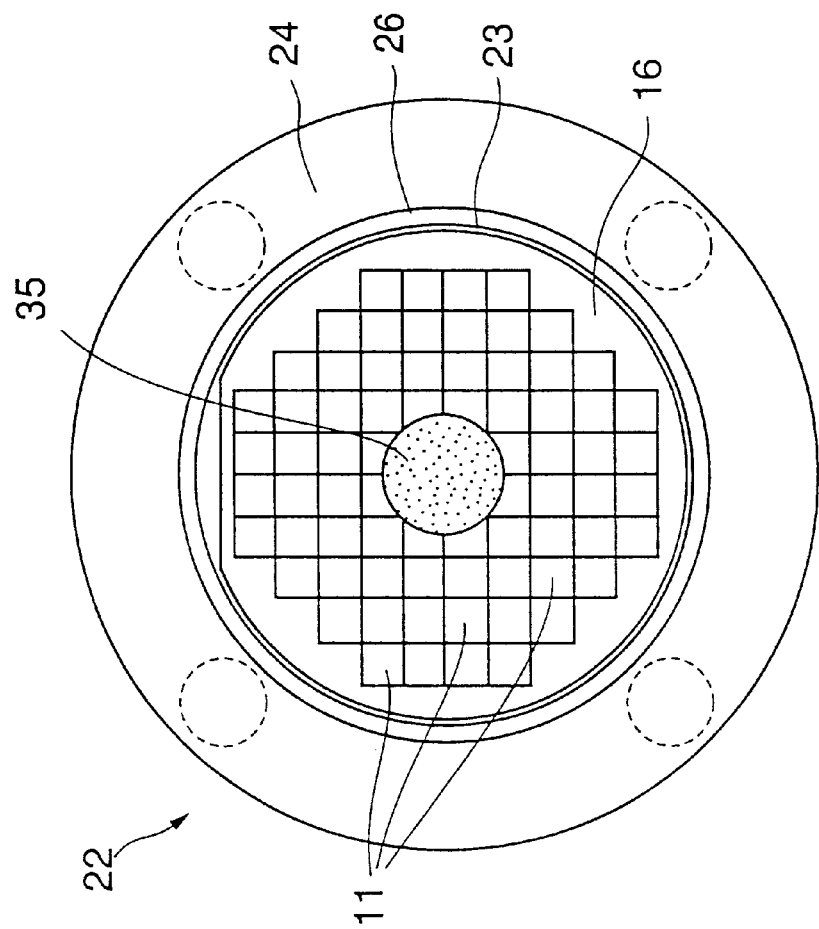
FIG. 3 is a plan view of a lower mold of the metal mold of FIG. 2.
Figure 4:
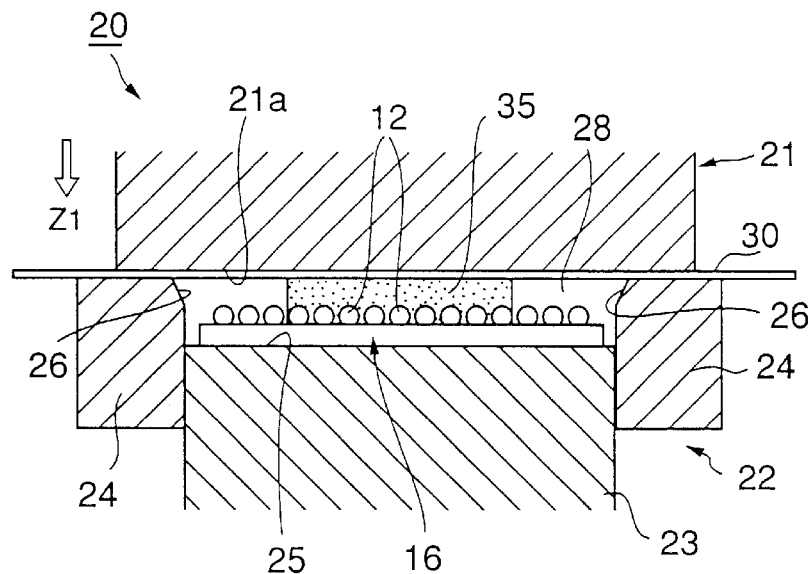
FIG. 4 shows the metal mold of FIG. 2, with the upper mold being moved down.
Figure 5:
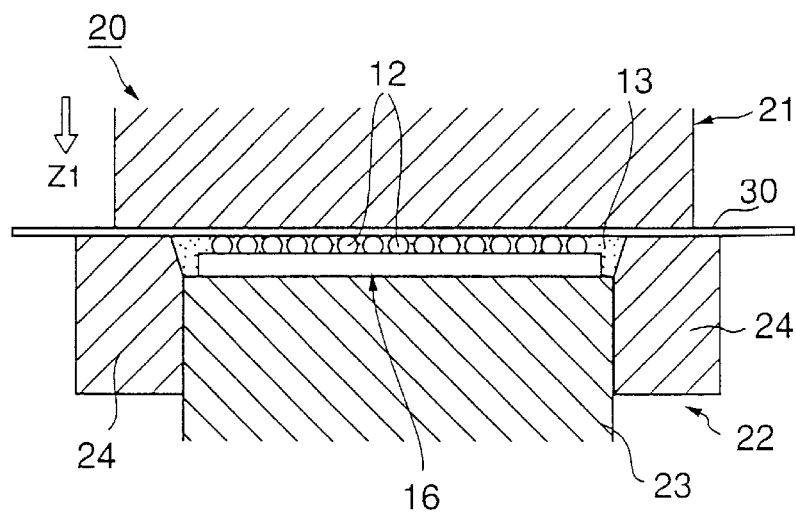
FIG. 5 shows the metal mold of FIG. 2, with the upper mold being moved further down.
Figure 6:
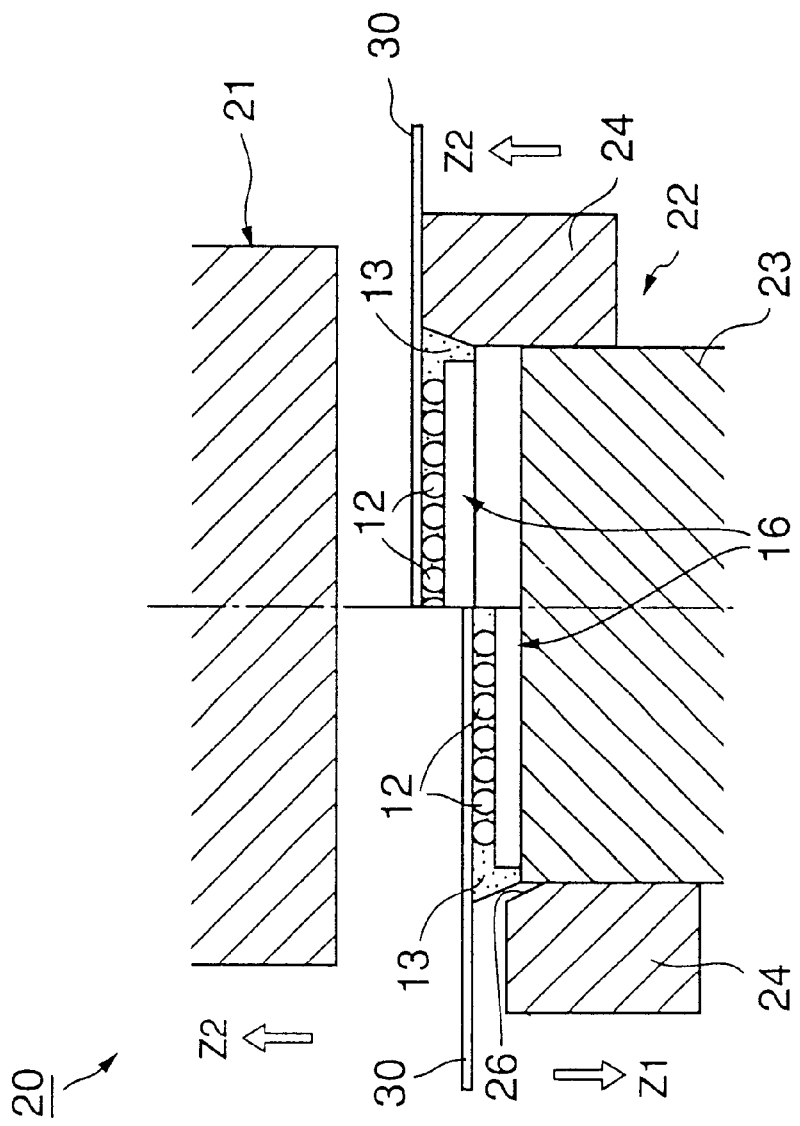
FIG. 6 shows the metal mold of FIG. 2 in an opened state.
Figure 7:
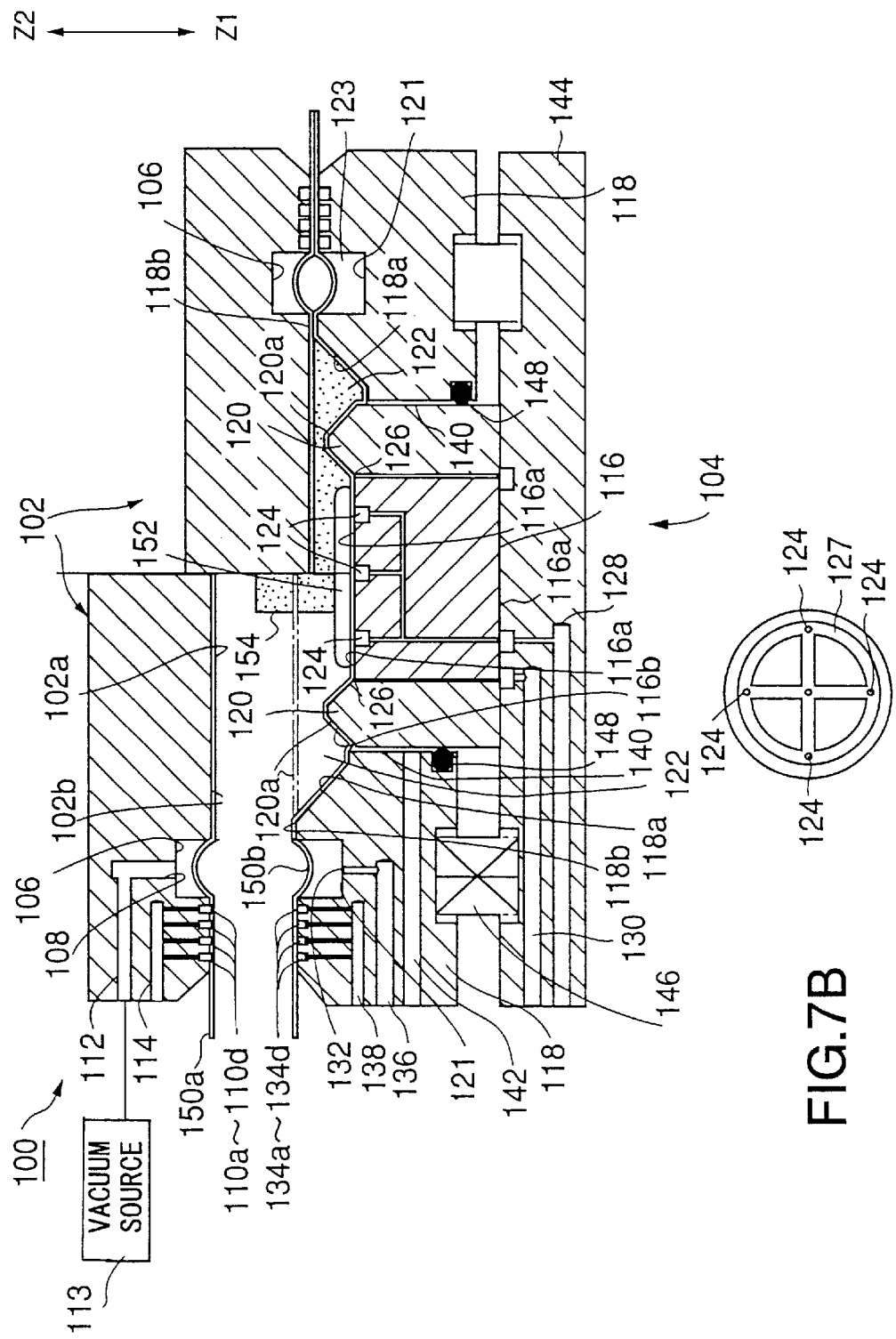
FIG. 7A is a front sectional view of a metal mold for producing semiconductor devices of a first embodiment of the present invention.
FIG. 7B is a plan view partially showing a lower mold of the metal mold of the first embodiment of the present invention.

The following is a description of preferred embodiment of a method of producing semiconductor devices and a metal mold for producing semiconductor devices in accordance with the present invention, with reference to the accompanying drawings.

FIGS. 7A to 15 show a first embodiment of the semiconductor device production method and the metal device in accordance with the present invention.

In FIG. 7A, the left half defined by a vertical center line shows a metal mold 100 for producing semiconductor devices in an opened state, and the right half shows the metal mold 100 in a closed state. The metal mold 100 is used to compress a material to produce a molded product, and comprises an upper mold (a first mold) 102 and a lower mold (a second mold) 104. The metal mold is provided with a heating source (not shown).

A cavity surface (a second cavity formed surface) 102a of substantially the same size and shape as a substrate 152 is formed on the lower surface of the upper mold 102, and a flat dividing surface 102b is formed along the outer periphery of the cavity surface 102a. An annular cavity portion 106 is formed in the flat dividing surface 102b. An annular suction groove (a second suction portion or a second suction groove) 108 is formed on the bottom surface (a dividing surface) of the cavity portion 106. Annular suction grooves (first suction portions or first suction grooves) 110a to 110d are further formed in the outer portion of the dividing surface 102 outside the cavity portion 106. These suction grooves 108 and 110a to 110d are connected to vacuum sources via communication channels 112 and 114. The vacuum sources can be controlled independently of one another. In FIG. 7A, only a vacuum source 113 connected to the communication channel 112 is shown. Here, the load effective area (a suction area) of the outer suction grooves 110a to 110d is larger than that of the inner suction groove 108. This also applies to the lower mold 104 and other embodiments. The upper mold 102 is energized by a drive (not shown) and is movable in directions of arrows Z1 and Z2 in FIG. 7A.

The lower mold 104 comprises an inner sub lower mold 116 and an outer sub lower mold 118 surrounding the inner sub lower mold 116. A cavity surface (a first cavity forming surface) 116a of substantially the same size and shape as the substrate 152 is formed on the upper surface of the inner sub lower mold 116. A tapered surface 106b downwardly inclined outward is formed along the outer periphery of the upper surface of the inner sub lower mold 116. The cavity surface 116a and the tapered surface 116b constitute a protruding portion 120. The cross section of the protruding portion 120 has a triangular shape as shown in FIG. 7A, and the top end portion 120a has a narrow flat surface. The cavity surface 116a and the tapered surface 116b both have an entirely flat surface. The outer sub lower mold 118 has a tapered surface 118a having an inclination opposite to the tapered surface 116b. The tapered surface 116b and the tapered surface 118a constitute a dummy cavity 122 for storing excess resin. A flat dividing surface 118b extending from the tapered surface 118a is also formed. The flat dividing surface 118b has a cavity portion 121 corresponding to the cavity portion 106. The cavity portions 106 and 121 constitute a spaced portion 123 for providing tension to separation sheet as described later.

In the cavity surface 116 of the inner sub lower mold 116, a plurality of suction grooves (third suction portions or third suction grooves) 124 are formed in the center and symmetrical positions on the periphery. The opening sides of the suction grooves communicate with each other through a groove portion 127 formed in the shape of a cross and a circle. The groove portion 127 will be sometimes included in the suction grooves 124. The suction grooves 124 and 126 are connected to vacuum sources via communication channels 128 and 130, respectively. The vacuum sources (not shown) can be controlled independently of each other.

An annular suction groove (second suction portions or second suction grooves) 132 is formed in the bottom surface (a dividing surface) of cavity portion 121 of the outer sub lower mold 118, and annular suction grooves (first suction portions or first suction grooves) 134a to 134d are formed in the outer part of the dividing surface 118b. The suction grooves 132, and 134a to 134d are connected to vacuum sources via communication channels 136 and 138, respectively. The vacuum sources (not shown) can be controlled independently of each other. Also, a gap 140 formed between the inner sub lower mold 116 and the outer sub lower mold 118 serves as a suction groove, and the gap 140 is connected to a vacuum source via a communication channel 142. The vacuum source can be controlled independently. Hereinafter, the space gap will be referred to as the suction groove 140.

The inner sub lower mold 116 is fixed onto a lower mold base 144. Meanwhile, a clamp spring 146 is disposed between the lower surface of the outer sub lower mold 118 and the upper surface of the lower mold base 144. The clamp spring 146 is movable in the directions of the arrows Z1 and Z2 in FIG. 7A, so that the outer sub lower mold 118 can be slidably in contact with the inner sub lower mold 116 via a slide member 148. The lower mold base 144 is disposed on a suitable base member (not shown).

In FIG. 7A, a separation sheet (a second separation sheet) 150a covers the cavity surface 102a and the dividing surface 102b of the upper mold 102. A separation sheet (a first separation sheet) 150b covers the cavity surface 116a and the tapered surface 116b of the inner sub lower mold 116, and the tapered surface 118a and the dividing surface 118b of the outer sub lower mold 118. The separation sheets 150a and 150b are both closely attached to the upper mold 102 and the lower mold 104, respectively. Also, the substrate 152 provided with a semiconductor chip having electrodes (not shown) is disposed in a predetermined position on the cavity surface 116a of the inner sub lower mold 116. An encapsulation resin 154 in the form of a resin tablet is disposed on the substrate 152.

A method of producing semiconductor devices using the metal mold 100 of the first embodiment described above will be described below, with reference to FIGS. 8 to 15.

At the beginning of a resin encapsulation process, the upper mold 102 is pushed upward in a stand-by position. The outer sub lower mold 118 is pushed by the clamp spring 146 to be positioned slightly higher than the inner sub lower mold 116, as shown in FIG. 8.

Figure 8:
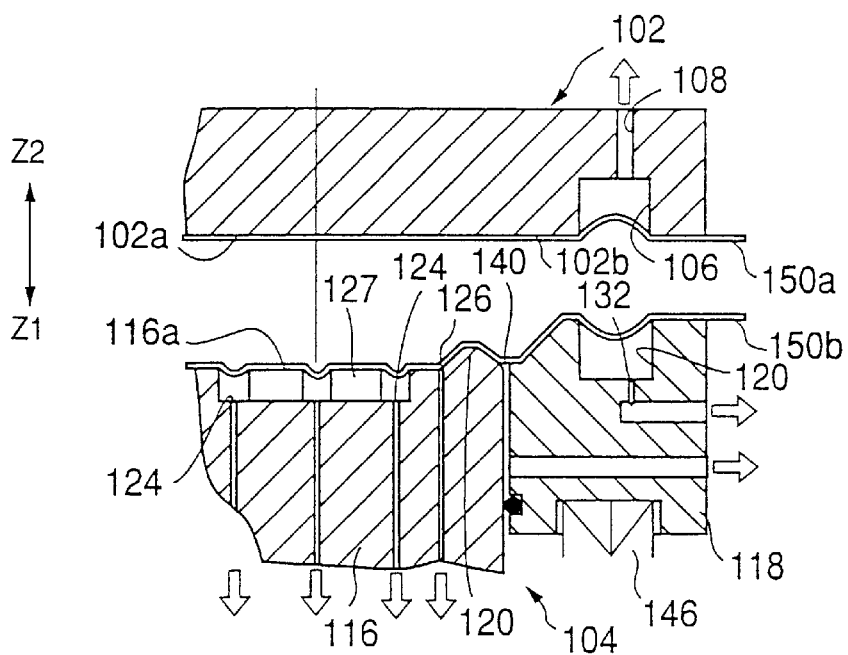
FIG. 8 is a sectional view partially showing the metal mold of the first embodiment at the start of a resin encapsulating process.
Figure 9:
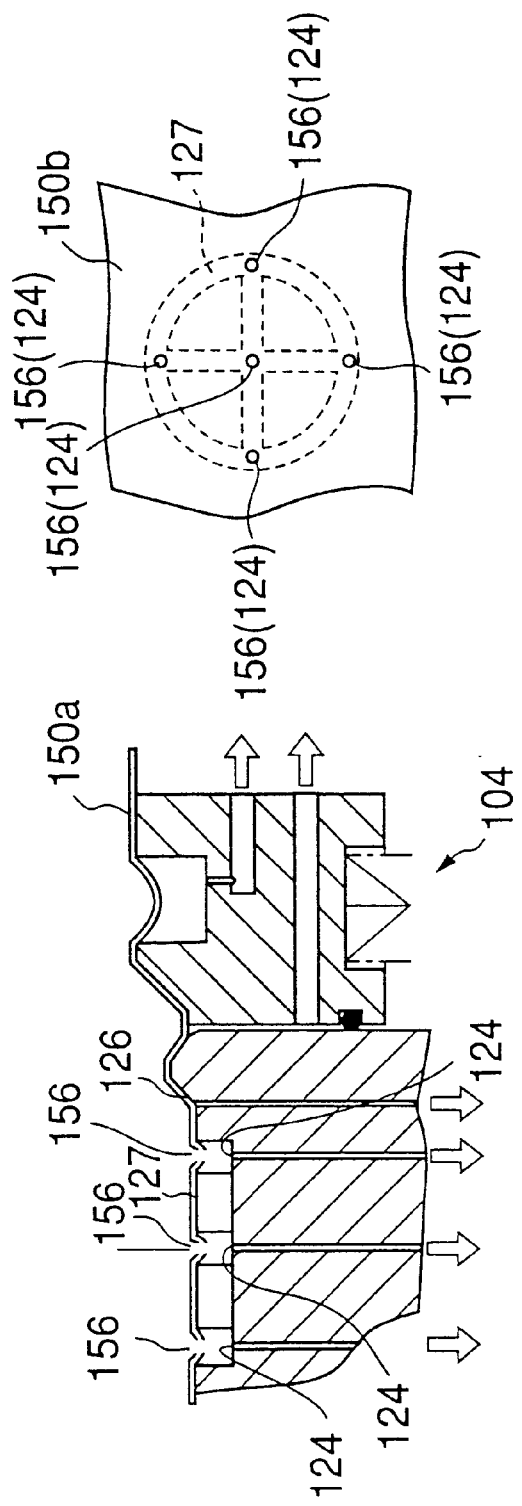
FIG. 9A is a sectional view partially showing the metal mold of the first embodiment when holes are formed in a separation sheet.
FIG. 9B is a plan view partially showing the lower mold.

In such a situation, each of the vacuum sources is driven in directions of outlined arrows in FIG. 8 (the same as in the other drawings and embodiments), and the two separation sheets 150*a* and 150*b* are closely placed on the cavity surface 102*a* and the dividing surface 102*b* of the upper mold 102, the cavity surface 116*a* and the tapered surface 116*b* of the inner sub lower mold 116, and the tapered surface 118*a* and the dividing surface 118*b* of the outer sub lower mold 118, thereby completing a separation sheet providing process. The separation sheets 150*a* and 150*b* are attracted toward the suction grooves 110*a* to 110*d* and 134*a* to 134*d*, and are thus attached and fixed onto the flat surface. The separation sheets 150*a* and 150*b* are next attracted toward the suction grooves 108 and 132, and are thus drawn into the spaced portion 123 formed between the cavity portions 106 and 121. By doing so, wrinkles in the separation sheets 150*a* and 150*b* can be eliminated, and the separation sheets 150*a* and 150*b* can be closely attached to the entire surfaces of the upper mold 102 and the lower mold 104. Also, the separation sheet 150*b* is attracted toward the suction grooves 126 and 140, so that the separation sheet 150*b* can be closely attached to the protruding portion 120 having the triangular cross section.

The separation sheets 150*a* and 150*b* are made of a material which does not deteriorate by heat in later steps, such as polyimide, vinyl chloride, PC, PET, biodegradation resin, synthetic paper, metallic foil, or a combination of these materials. Apart from heat resistance, the material for the separation sheets 150*a* and 150*b* needs to have desired elasticity that is high enough to have the top ends of the electrodes lodged in the separation sheet 150*a*.

As shown in FIGS. 9A and 9B, the separation sheet 150*b* is attracted into the suction grooves 124 and 126, so that the separation sheet 150*b* is closely attached to the cavity surface 116*a*. Here, the separation sheet 150*b* is so strongly drawn toward the suction grooves 124 by a high vacuum that the separation sheet 150*b* is cut by the wall of each of the suction grooves 124. Thus, holes 156 can be easily and surely formed in the predetermined positions corresponding to the suction grooves 124.

Figure 10:
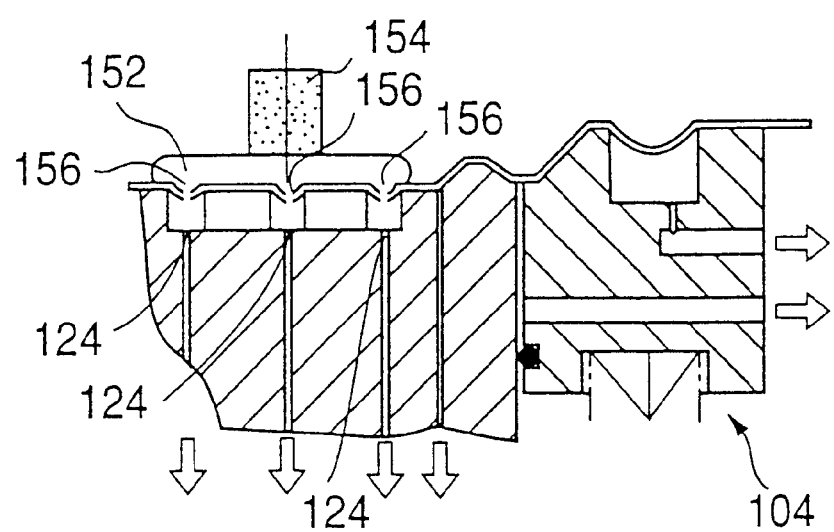
FIG. 10 is a sectional view partially showing the metal mold of the first embodiment when a substrate and resin are placed.

As shown in FIG. 10, the substrate 152 provided with the electrodes is placed in a predetermined position on the separation sheet 150*b* on the cavity surface 116*a* of the inner sub lower mold 116, with the electrodes facing upward (a substrate disposing step). The encapsulation resin 154 is disposed on the substrate 152. The bottom surface of the substrate 152 is attracted into the suction grooves 124 via the holes 156 of the separation sheet 150*b*, so that the substrate 152 can be closely attached to the separation sheet 150*b*.

The encapsulation resin 154 is made of polyimide, epoxy (thermoplastic resin such as PPS, PEEK, PES, or heat resistant crystal resin), or the like. In this embodiment, the encapsulation resin 154 is a cylindrically formed resin tablet.

The semiconductor chips are electronic circuits formed on the substrate, and a number of protruding electrodes or metal posts are formed on the mounting side surface of each of the semiconductor chips. In a case where protruding electrodes are employed, soldering balls are disposed by a transfer technique, and the protruding electrodes function as external connecting electrodes. Also, such protruding electrodes are disposed directly on electrodes pads formed on each semiconductor chip. In a case where metal posts are employed, the metal posts are formed by a lithography technique, and serve to connect the substrate to external terminals. After connecting wires are provided to the electrode pads, the metal posts are connected to the connecting wires in a standing state.

Figure 11:
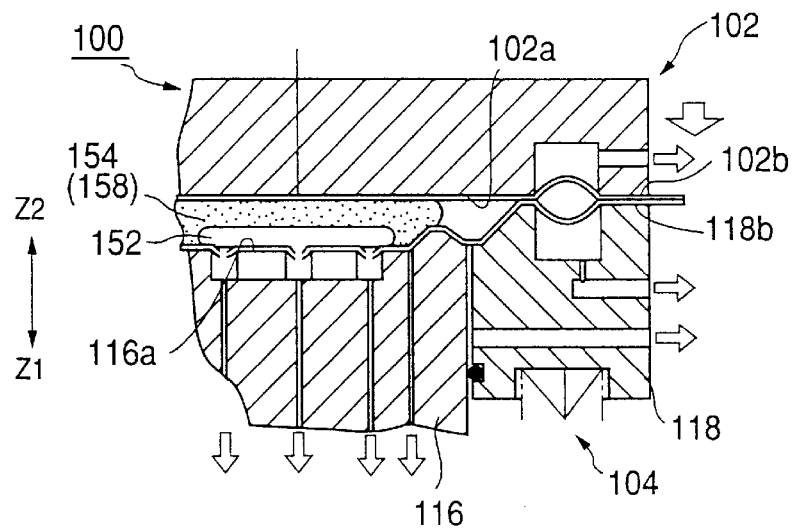
FIG. 11 is a sectional view partially showing the metal mold of the first embodiment when an upper mold is moved down.

Next in a resin layer forming process, the metal mold 100 is heated to a predetermined temperature, and the drive source is energized to move the upper mold 102 down in the direction of the arrow Z1, as shown in FIG. 11. The dividing surface 102*b* of the upper mold and the dividing surface 118*b* of the outer sub lower mold 118 are almost brought into contact with each other in such a manner that a narrow gap is formed in between. Here, a cavity 158 is formed between the cavity surfaces 102*a* and 116*a*, and the melted encapsulation resin 154 is pushed into the cavity 158. Since the reverse side of the substrate 152 is closely attached to the separation sheet 150*b*, there is no risk of the melted encapsulation resin 154 spreading onto the reverse side of the substrate 152.

Figure 12:
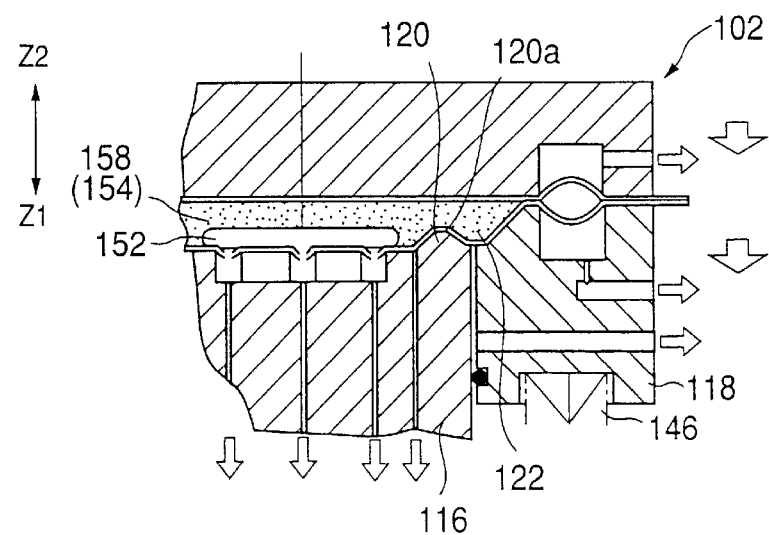
FIG. 12 is a sectional view partially showing the metal mold of the first embodiment when upper mold is moved further down.

As shown in FIG. 12, the upper mold 102 is moved down in the direction of the arrow Z1 until a desired pressure (molding pressure) is obtained to compress the clamp spring 146. As the clamp spring 146 is compressed, the outer sub lower mold 118 slides on the outer periphery of the fixed inner sub lower mold 116, and slightly moves down in the direction of the arrow Z1. As a result, the cavity 158 contracts, and an excess portion of the encapsulation resin 154 (hereinafter referred to as excess resin 154') after filling the cavity 158 is discharged into the dummy cavity 122 beyond the annular protruding portion 120. Here, since the protruding portion 120 has the flat end portion 120*a*, the excess resin 154' can be evenly discharged from the cavity 158 into the dummy cavity 122. Also, since the protruding portion 120 has a triangular shape, the excess resin 154' can be discharged with excellent fluidity. Furthermore, the separation sheet 150*b* is attracted to the bottom surfaces of the respective cavity portions 106 and 121 in the spaced portion 123 from the suction grooves 108 and 132. Even if the outer sub lower mold 118 moves down and shifts from the inner sub lower mold 116 to cause the slack to the separation sheet 150*b*, the slack can be easily eliminated so that the separation sheet 150*b* can be maintained in the tensed state.

With this structure, the excess resin 154', which leads to defects such as voids and pinholes, can be discharged into the dummy cavity 122. Also, even if there are differences between the electrodes of the respective lots of the substrate, a resin layer having a predetermined thickness can be easily formed without accurate advance measurement of the resin to be supplied into the metal mold. There is no need to vary the amount of resin depending on the type or size of semiconductors.

The melted encapsulation resin 154 is then applied to the entire surface of the electro-deformed surface of the semiconductor chips to form a resin layer. The electrodes attached to the semiconductor chips are thus encapsulated with resin. However, the top ends of the electrodes are exposed from the encapsulation resin 154 and are lodged in the separation sheet 150*a*.

Figure 13:
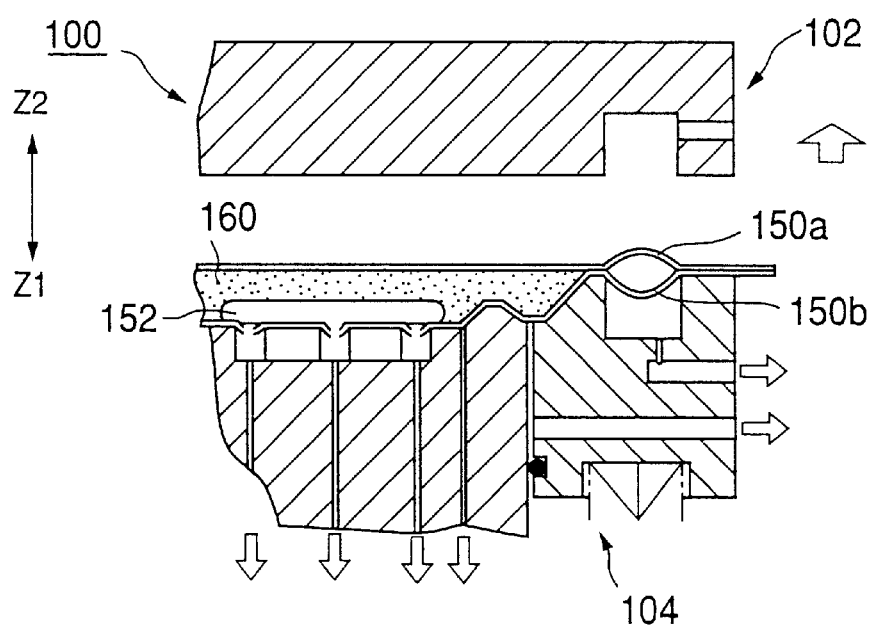
FIG. 13 is a sectional view partially showing the metal mold of the first embodiment when the upper mold is moved up.

Next in a substrate taking out process, the encapsulation resin 154 solidifies after a certain period of time to form an encapsulation resin layer 160 (hereafter referred to as "resin layer 160"). The vacuum sources of the upper mold 102 are then stopped, and the upper mold 102 is moved up in the Z2 direction to open the metal mold 100, as shown in FIG. 13. After the vacuum sources of the lower mold 104 are stopped, the substrate 152 provided with the resin layer 160 as well as the separation sheets 150*a* and 150*b* is separated from the metal mold 100. Since the encapsulation resin 154 is not in direct contact with the metal mold 100 and the encapsulation resin 154 and the metal 100 are effectively separated by the separation sheets 150*a* and 150*b*, the substrate 152 can be easily separated from the metal mold 100.

Figure 14:
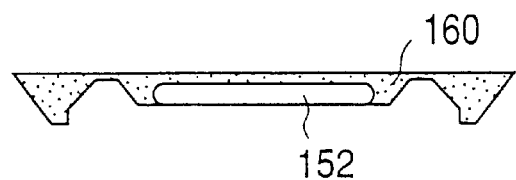
FIG. 14 shows the substrate taken out of the metal mold of the first embodiment after resin encapsulation.
Figure 15:
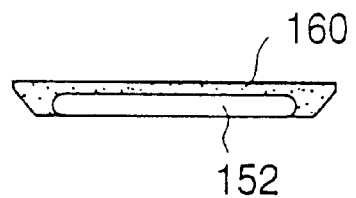
FIG. 15 shows the substrate of FIG. 14 in a trimmed state.

The separation sheets 150a and 150b are then removed from the substrate 152, leaving the substrate 152 and the resin layer 160 as shown in FIG. 14. Even if a small portion of the resin layer 160 exists on the top ends of the electrodes, such a portion will be removed together with the separation sheet 150a, so that the top ends of the electrodes are exposed. The thin film portion of the resin layer 160 is then trimmed to remove the unnecessary part of the resin layer 160, as shown in FIG. 15. The resin encapsulation of the substrate 152 is thus completed, and the substrate 152 is divided into semiconductor devices in a dividing process. In a case where metal posts are employed as the electrodes of the substrate 152, the exposed top ends of the metal posts are equipped with solder balls, and the substrate 152 is then divided into semiconductor devices.

In accordance with the first embodiment described above, surface roughening of the resin layer 160 can be prevented, since no wrinkles are caused in the separation sheets 150a and 150b. Also, there is substantially no need to clean the metal mold 100, because the encapsulation resin 154 (or the resin layer 160) does not stick to the metal mold 100. In addition, the outer sub lower mold 118 can be prevented from wrong operations and damage from the sliding movements, since the encapsulation resin 154 does not ender the gap between the inner sub lower mold 116 and the outer sub lower mold 118.

Referring now to FIGS. 16 to 23, a method of producing semiconductor devices and a metal mold for producing semiconductor devices in accordance with a second embodiment of the present invention will be described below.

Figure 16:
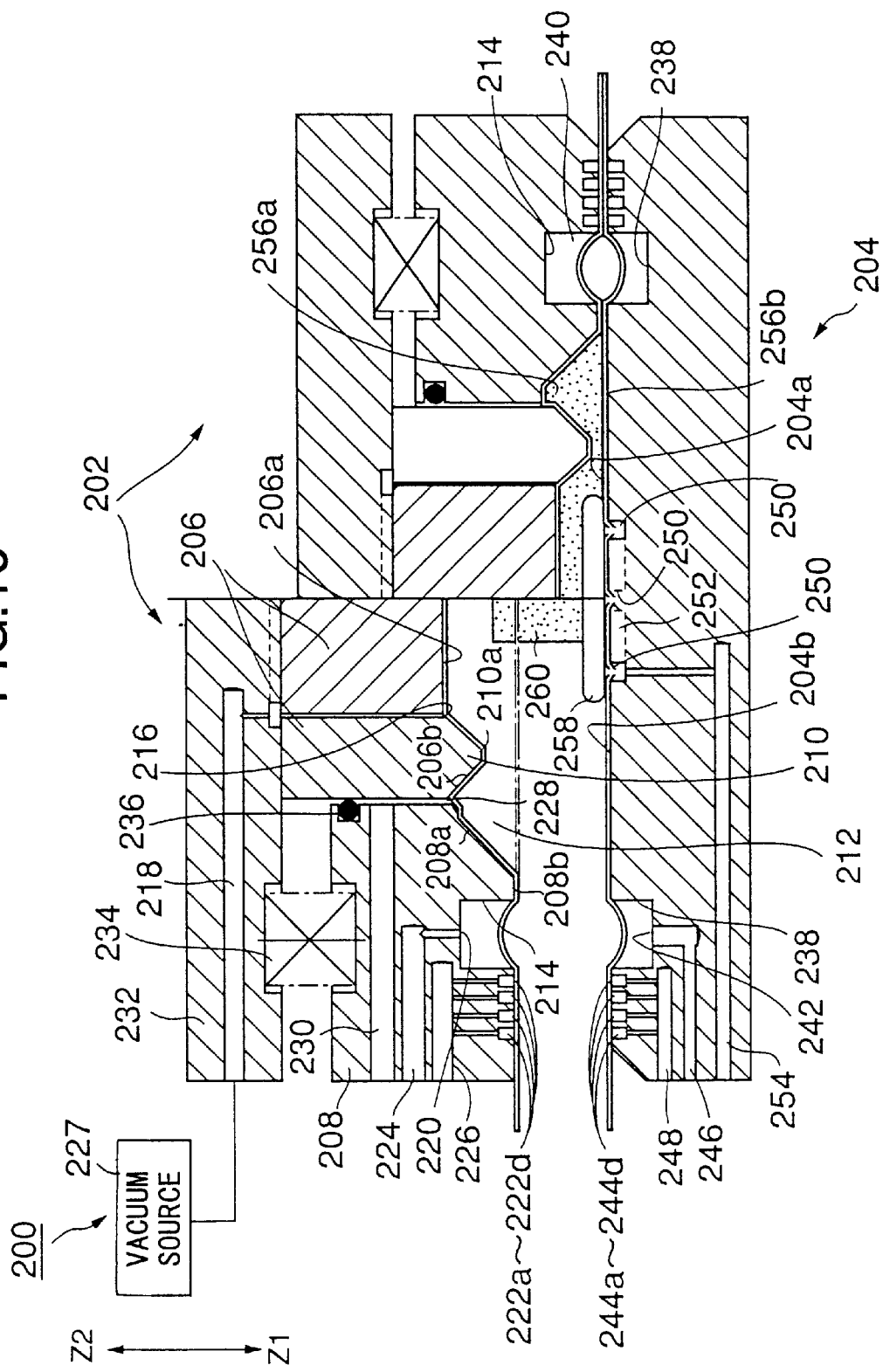
FIG. 16 is a front sectional view of a metal mold for producing semiconductor devices of a second embodiment of the present invention.

In FIG. 16, the left half defined by a vertical center line shows a metal mold 200 in an opened state, the right half shows the metal mold 200 in a closed state. The metal mold 200 basically has the same structure as the metal mold 100 of the first embodiment, but the metal mold 200 differs from the metal mold 100 in the shape of the cavity surfaces of the respective upper and lower molds and in the position of the clamp spring.

The metal mold 200 is a dividable metal mold, comprising an upper mold (a second metal mold) 202 and a lower mold (a first metal mold) 204. The metal mold 200 is provided with a heating source not shown in the drawings.

The upper mold 202 comprises an inner sub upper mold 206 and an outer sub upper mold 208 which surrounds the inner sub upper mold 206. The lower surface of the inner sub upper mold 206 includes a cavity surface (a second cavity forming surface) 206a having substantially the same size, shape, and height as a substrate 258. A tapered surface 206b which is upwardly tapered toward the outside is formed along the outer periphery of the cavity surface 206a, as shown in FIG. 16. The cavity surface 206a and the tapered surface 206b form an annular protruding portion 210. The protruding portion 210 has a triangular cross section as shown in FIG. 16, and has a flat top end 210 formed along the entire outer periphery of the cavity surface 206a. The cavity surface 206a and the tapered surface 206b are both flat. Another tapered surface 208a having an inclination opposite to the tapered surface 206b is formed on the lower surface of the outer sub upper mold 208. The tapered surfaces 206b and 208a form a dummy cavity 212 for accommodating excess resin. A dividing surface 208b extends from the tapered surface 208a, and has a cavity portion 214.

An annular suction groove 216 is formed on the boundary between the flat portion and the tapered portion of the cavity surface 206a of the inner sub upper mold 206. The annular suction groove 216 communicates with a vacuum source (not shown) via a communication channel 218. The vacuum source can be controlled independently.

Another annular suction groove (a second suction portion or a second suction groove) 220 is formed in the bottom surface (a dividing surface) of the cavity portion 214 of the outer sub upper mold 208. Annular suction grooves (first suction portions or first suction grooves) 222a to 222d are further formed in the outer portion of the dividing surface 208b outside the cavity portion 214. These suction grooves 220 and 222a to 222d are connected to vacuum sources via communication channels 224 and 226. The vacuum sources can be controlled independently of one another. In FIG. 16, only a vacuum source 227 connected to the communication channel 218 is shown. Here, a gap 228 between the inner sub upper mold 206 and the outer sub upper mold 208 also serves as a suction groove, and is connected to an independently controllable vacuum source (not shown) via a communication channel 230. The gap 228 will be hereinafter referred to as the suction groove 228.

The upper surface of the inner sub upper mold 206 is fixed to an upper mold base 232. A clamp spring 234 is disposed between the upper surface of the outer sub upper mold 208 and the lower surface of the upper mold base 232, so that the outer sub upper mold 208 slides on the outer peripheral surface of the inner sub upper mold 206 via a slide member 236 in the directions of arrows Z1 and Z2 shown in FIG. 16. The upper mold base 232 is pushed by a driving unit (not shown) to be movable in the directions of the arrows Z1 and Z2.

A flat cavity surface (a first cavity forming surface) 204a having substantially the same size as the substrate 258 is formed on the upper surface of the lower mold 204, and a dividing surface 204b extends from the outer periphery of the cavity surface 204a. The dividing surface 204b is provided with an annular cavity portion 238 in a position corresponding to the cavity portion 214. The cavity portions 214 and 238 constitute a spaced portion 240. The dividing surface 204b including the cavity surface 204a is entirely flat. The cavity surface 204a is provided with suction grooves (third suction portions or third suction grooves) 250 and a groove portion 252 communicating with the suction grooves 250. The suction grooves 250 and the groove portion 252 are the same as the suction grooves 124 and the groove portion 127 of the metal mold 100 of the first embodiment, and are connected to an independently controllable vacuum source (not shown) via a communication channel 254. An annular suction groove (a second suction portion or a second suction groove) 242 is formed in the bottom surface (a dividing surface) of the cavity portion 238. Further, annular suction grooves (first suction portions or first suction grooves) are formed in the outer portion of the dividing surface 204b outside the cavity portion 238. These suction grooves 242 and 244a to 244d are connected to independently controllable vacuum sources (not shown) via communication channels 246 and 248. The lower mold 204 is placed on a base (not shown).

As shown in FIG. 16, a separation sheet (a second separation sheet) 256a closely contacts the cavity surface 206a and the tapered surface 206b of the inner sub upper mold 206 and the tapered surface 208a and the dividing surface 208b of the outer sub upper mold 208 of the upper mold 202. Another separation sheet (a first separation sheet) 256b also closely contacts the cavity surface 204a and the dividing surface 204b of the lower mold 204. The substrate 258 provided with semiconductor chips having electrodes (not shown) is then placed in a position on the cavity surface 204a of the lower mold 204, with the electrodes facing upward in FIG. 16. An encapsulating resin 260 is supplied on the substrate 258 placed on the cavity surface 204a.

Figure 17:
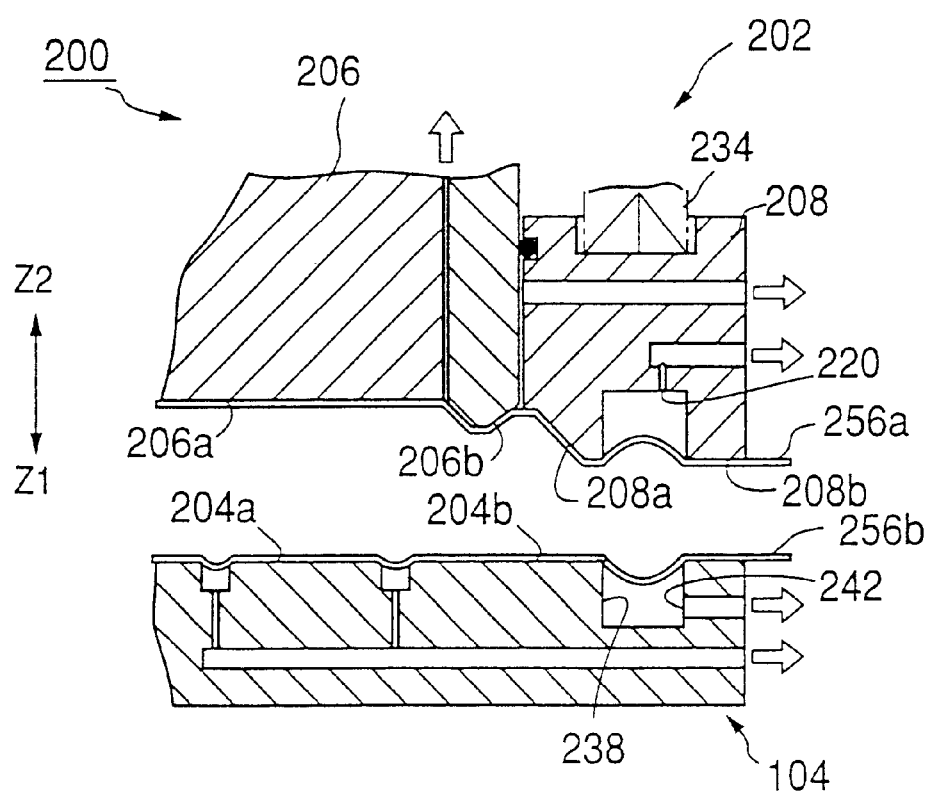
FIG. 17 is a sectional view partially showing the metal mold of the second embodiment at the beginning of a resin encapsulation process.

At the start of a resin encapsulation process, the upper mold 202 comprising the inner sub upper mold 206 and the outer sub upper mold 208 is held in a higher position, while the lower mold 204 is placed on the base, as shown in FIG. 17. Here, the clamp spring 234 is maintained in an expanded state so as to keep the dividing surface 208b in a position slightly lower than the cavity surface 206a.

In a separation sheet disposing process, the separation sheet 256a is placed on the cavity surface 206a and the tapered surface 206b of the inner sub upper mold 206 and the tapered surface 208a and the dividing surface 208b of the outer sub upper mold 208 of the upper mold 202. The separation sheet 256b is placed on the cavity surface 204a and the dividing surface 204b of the lower mold 204. The two separation sheets 256a and 256b in a tensed state are then attracted toward the suction grooves 222a to 222d and 244a to 244d, and are thus closely attached and fixed to the upper and lower molds 202 and 204. The separation sheets 256a and 256b are next attracted toward the suction grooves 220 and 242, and are thus drawn into the spaced portion 240. By doing so, wrinkles in the separation sheets 256a and 256b can be eliminated, and the separation sheets 256a and 256b can be closely attached to the entire surfaces of the upper mold 202 and the lower mold 204. The suction groove 242 shown in FIG. 17 is a modification example, being formed in the side wall of the cavity portion 238. Also, the separation sheet 256a is attracted toward the suction grooves 216 and 228, so that the separation sheet 256a can be closely attached to the protruding portion 210 having the triangular cross section.

Figure 18:
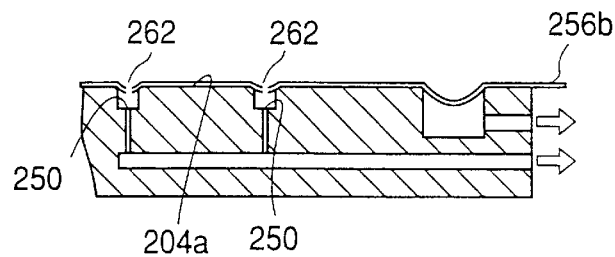
FIG. 18 is a sectional view partially showing the metal mold of the second embodiment when holes are formed in a separation sheet.

As shown in FIG. 18, the separation sheet 256b is attracted toward the suction grooves 250, and is thus closely attached to the cavity surface 204a. Here, the separation sheet 256b is so strongly drawn toward the suction grooves 250 by a high vacuum that the separation sheet 256b is cut by the wall of each of the suction grooves 250. Thus, holes 262 can be easily and surely formed in the separation sheet 256b as in the first embodiment.

Figure 19:
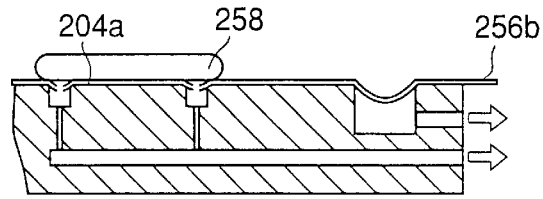
FIG. 19 is a sectional view partially showing the metal mold of the second embodiment when a substrate is placed.
Figure 20:
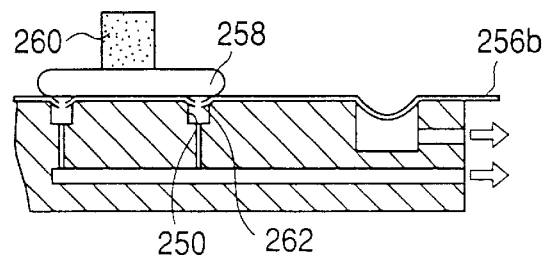
FIG. 20 is a sectional view partially showing the metal mold of the second embodiment when an encapsulation resin is supplied.

In a substrate disposing process, the substrate 258 provided with the electrodes is placed in a predetermined position on the separation sheet 256b on the cavity surface 204a of the lower mold 204, with the electrodes facing upward, as shown in FIG. 19. The encapsulation resin 260 is disposed on the substrate 258, as shown in FIG. 20. The bottom surface of the substrate 258 is attracted toward the suction grooves 250 via the holes 262 of the separation sheet 256b, so that the substrate 258 can be closely attached to the separation sheet 256b.

Figure 21:
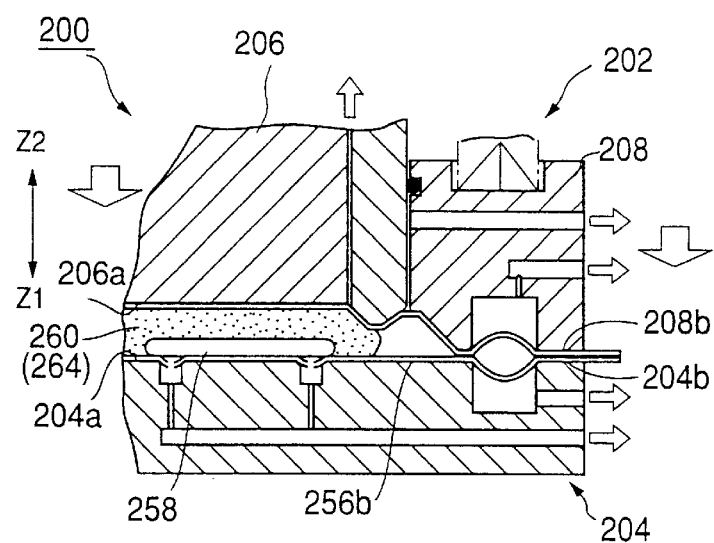
FIG. 21 is a sectional view partially showing the metal mold of the second embodiment when an upper mold is moved down.

Next in a resin layer forming process, the metal mold 200 is heated to a predetermined temperature, and the upper mold 202 is moved down in the direction of the arrow Z1, as shown in FIG. 21. The dividing surface 208b of the outer sub upper mold 208 and the dividing surface 204b of the lower mold 204 are almost brought into contact with each other in such a manner that a narrow gap is formed in between. Here, a cavity 264 is formed between the cavity surfaces 206a and 204a, and the melted encapsulation resin 260 is pushed into the cavity 264. Since the reverse side of the substrate 258 is closely attached to the separation sheet 256b, there is no risk of the melted encapsulation resin 260 spreading onto the reverse side of the substrate 258.

Figure 22:
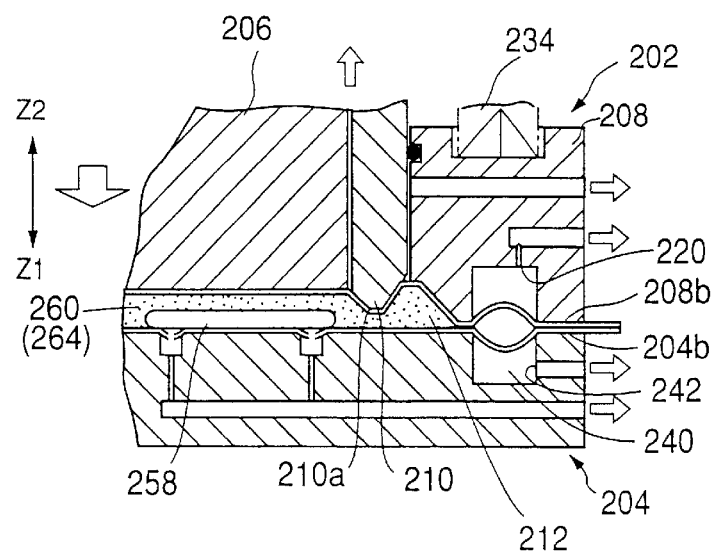
FIG. 22 is a sectional view partially showing the metal mold of the second embodiment when the upper mold is moved further down.

As shown in FIG. 22, the upper mold 202 (or the upper mold base 232) is moved down in the direction of the arrow Z1 until a desired pressure (molding pressure) is obtained to compress the clamp spring 234. As the clamp spring 234 is compressed, the inner sub upper mold 206 slides on the inner peripheral surface of the outer sub upper mold 208, and slightly moves down in the direction of the arrow Z1. As a result, the cavity 264 contracts, and an excess portion of the encapsulation resin 260 (hereinafter referred to as excess resin 260') after filling the cavity 264 is discharged into the dummy cavity 212 beyond the annular protruding portion 210. Here, since the protruding portion 210 has the flat end portion 210a, the excess resin 260' can be evenly discharged from the cavity 264 into the dummy cavity 212. Also, since the protruding portion 210 has a triangular shape, the excess resin 260' can be discharged with excellent fluidity. Furthermore, the separation sheets 256a and 256b are always attracted to the bottom surfaces of the respective cavity portions 214 and 238 in the spaced portion 240 from the suction grooves 220 and 242. Even if the outer sub upper mold 208 moves down and shifts from the inner sub upper mold 206 to cause the slack to the separation sheet 256a, the slack can be easily eliminated so that the separation sheet 256a can be maintained in the tensed state.

With this structure, the excess resin 260', which leads to defects such as voids and pinholes, can be discharged into the dummy cavity 212, as in the first embodiment. Even if there are differences between the electrodes of the respective lots of the substrate 258, a resin layer having a predetermined thickness can be easily formed without accurate advance measurement of the resin to be supplied into the metal mold. Also, there is no need to vary the amount of resin depending on the type or size of semiconductors.

As in the first embodiment, the top ends of the electrodes are exposed from the encapsulation resin 260 and are lodged in the separation sheet 256a.

Figure 23:
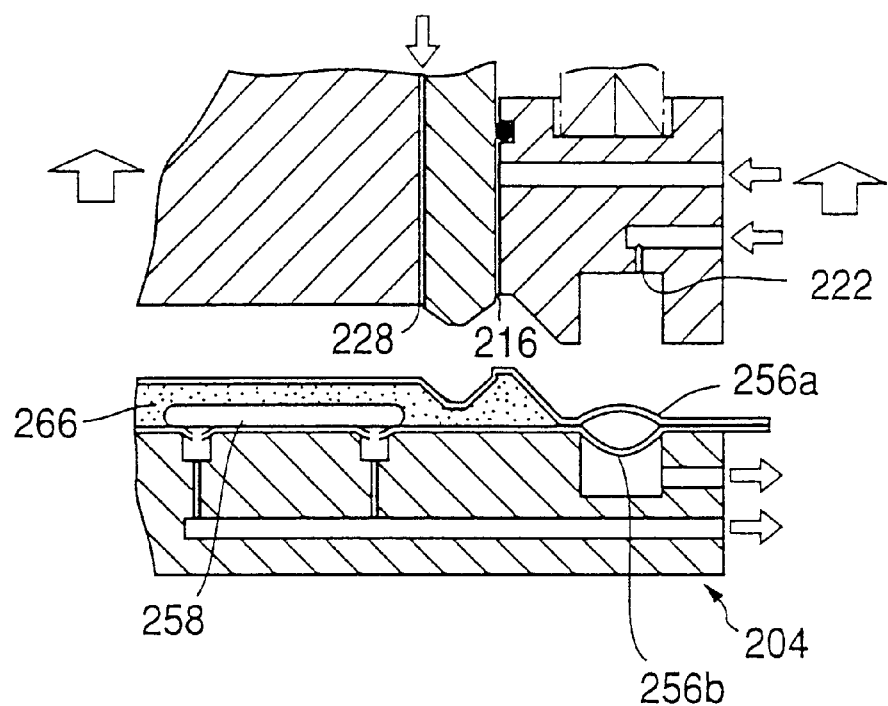
FIG. 23 is a sectional view partially showing the metal mold of the second embodiment when the upper mold is moved up.

Next in a substrate taking out process, the encapsulation resin 260 solidifies after a certain period of time to form a resin layer 266. The vacuum sources of the upper mold 202 are then stopped, and a pressure source (not shown) is energized to provide a fluid pressure to the separation sheet 256a through the suction grooves 216, 220, 222, and 228. At the same time, the upper mold 202 is moved up in the Z2 direction to open the metal mold 200, as shown in FIG. 23. The separation sheet 256a is readily removed from the upper mold 202 by virtue of the fluid pressure. After the vacuum sources of the lower mold 204 are stopped, the substrate 258 provided with the resin layer 266 as well as the separation sheets 256a and 256b are separated from the metal mold 200. Since the encapsulation resin 260 is not in direct contact with the metal mold 200 and the encapsulation resin 260 and the metal 200 are effectively separated by the separation sheets 256a and 256b, the substrate 258 can be easily separated from the metal mold 200.

The separation sheets 256a and 256b are then removed from the substrate 258, and the substrate 258 is trimmed to remove the unnecessary portion of the resin layer 266, as in the first embodiment. The resin encapsulation of the substrate 258 is thus completed, and the substrate 258 is divided into semiconductor devices in a dividing process.

In accordance with the second embodiment described above, surface roughening of the resin layer 266 can be prevented, since no wrinkles are caused in the separation sheets 256a and 256b. Also, there is substantially no need to clean the metal mold 200, because the encapsulation resin 260 (or the resin layer 266) does not stick to the metal mold 200. In addition, the outer sub upper mold 208 can be prevented from wrong operations and damage from the sliding movements, since the encapsulation resin 260 does not ender the gap between the inner sub upper mold 206 and the outer sub upper mold 208.

Referring now to FIGS. 24 to 35, a method of producing semiconductor devices and a metal mold for producing semiconductor devices in accordance with a third embodiment of the present invention will be described below.

Figure 24:
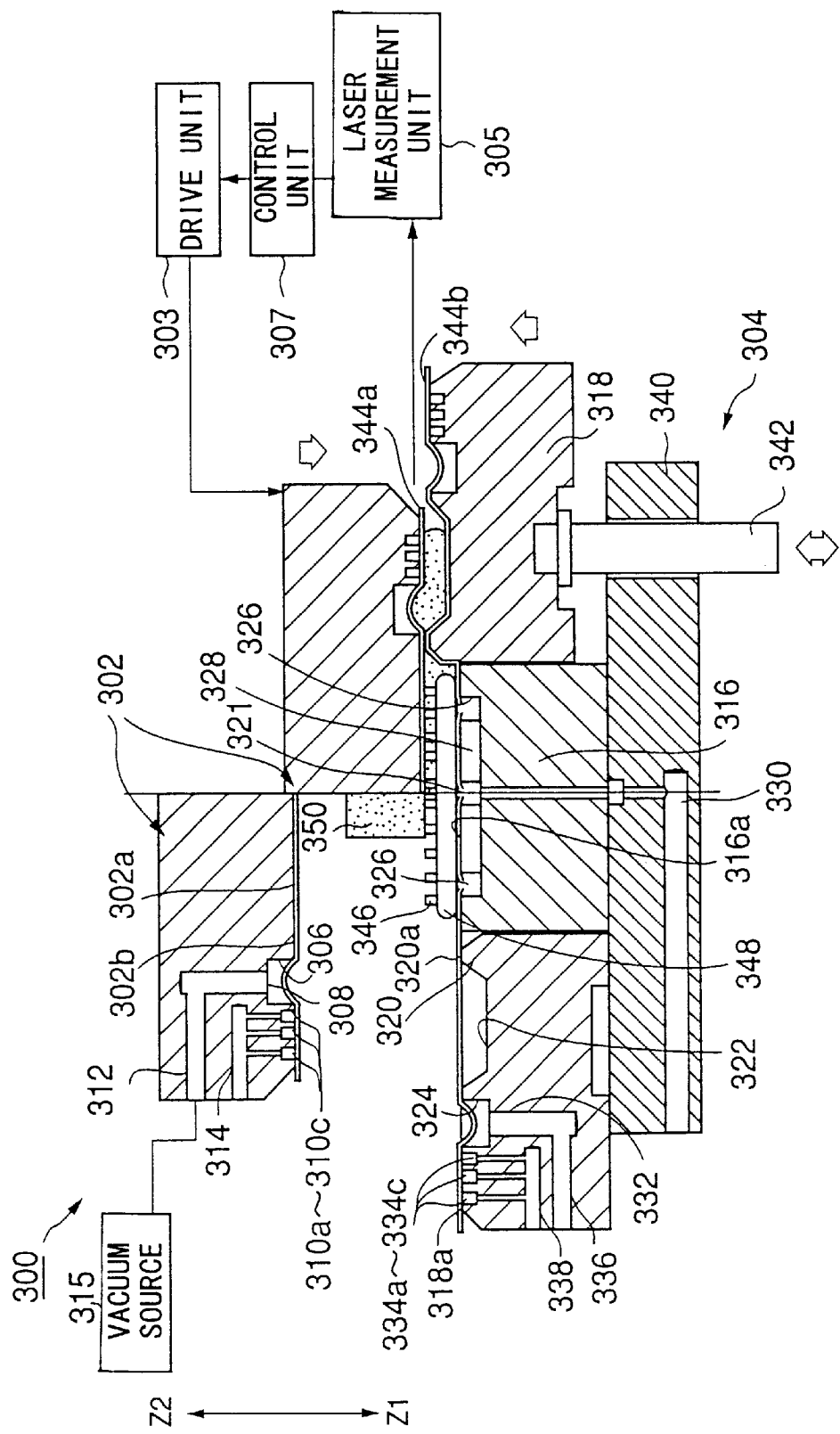
FIG. 24 is a front sectional view showing a metal mold for producing semiconductor devices of a third embodiment of the present invention.

In FIG. 24, the left half defined by a vertical center line shows a metal mold 300 in an opened state, the right half shows the metal mold 300 in a closed state. The metal mold 300 basically has the same structure as the metal molds 100 and 200 of the first and second embodiments, but the metal mold 300 differs from the metal molds 100 and 200 in the ascending and descending movements of the upper and lower molds.

The metal mold 300 is a dividable metal mold, comprising an upper mold (a second metal mold) 302 and a lower mold (a first metal mold) 304. The metal mold 300 is provided with a heating source not shown in the drawings.

The lower surface of the upper mold 302 includes a flat cavity surface (a second cavity forming surface) 302a having substantially the same size and shape as a substrate 348. A dividing surface 302b extends from the outer periphery of the cavity surface 302a. The dividing surface 302b is provided with an annular cavity portion 306. The dividing surface 302b including the cavity surface 302a is entirely flat. An annular suction groove (a second suction portion or a second suction groove) 308 is formed in the bottom surface (a dividing surface) of the cavity portion 306, and annular suction grooves (first suction portions or first suction grooves) 310a to 310c are further formed in the outer portion of the dividing surface 302b outside the cavity portion 306. These suction grooves 308 and 310a to 310c are connected to independently controllable vacuum sources via communication channels 312 and 314. In FIG. 24, only a vacuum source 315 connected to the communication channel 312 is shown. The upper mold 302 is energized by a drive unit 303, and is movable in directions of arrows Z1 and Z2 shown in FIG. 24.

The lower mold 304 comprises an inner sub lower mold (a fixed sub metal mold) 316 and an outer sub lower mold (a movable sub metal mold) 318 surrounding the inner sub lower mold 316. The upper surface of the inner sub lower mold 316 includes a flat cavity surface (a first cavity forming surface) 316a having substantially the same size and shape as the substrate 348. A dividing surface 318a is formed on the upper surface of the outer sub lower surface 318. The dividing surface 318a has annular tapered surfaces along the outer periphery of the cavity surface 316a. The tapered surfaces have opposite inclinations, thereby forming a protruding portion 320 having a triangular cross section with a narrow flat top end portion 320a. Also, an annular concave portion 322 which serves as a dummy cavity for accommodating excess resin is formed outside the protruding portion 320. Another concave portion 324 is formed outside the dummy cavity 322. In this embodiment, the upper mold 302 has a smaller diameter than the lower mold 304. As a result, the concave portion 324 is not situated in a position corresponding to the concave portion 306. Instead, the dummy cavity 322 is situated in the position corresponding to the concave portion 306. Accordingly, the dummy cavity 322 has an outwardly opening portion. Also, the concave portions 306 and 324 constitute a spaced portion for providing tension to the separation sheets.

The cavity surface 316a of the inner sub lower mold 316 is provided with suction grooves (third suction portions or third suction grooves) 326 and a groove portion 328 which are the same as the suction grooves 124 and the groove portion 127 of the first embodiment. The suction grooves 326 and the groove portion 328 are connected to an independently controllable vacuum source (not shown) via a communication channel 330.

Another annular suction groove (a second suction portion or a second suction groove) 332 is formed in the bottom surface (a dividing surface) of the cavity portion 324 of the outer sub lower mold 318. Annular suction grooves (first suction portions or first suction grooves) 334a to 334c are further formed in the outer portion of the dividing surface 318b outside the cavity portion 324. These suction grooves 332 and 334a to 334c are connected to independently controllable vacuum sources via communication channels 336 and 338.

The inner sub lower mold 316 is fixed onto a lower mold base 340, while the lower surface of the outer sub lower mold 318 is attached to an end portion of a cylinder 342 penetrating through the lower mold base 340. This cylinder 342 energizes the outer sub lower mold 318 to slide on the outer peripheral surface of the inner sub lower mold 316 via a slide member (not shown) in the directions of the arrows Z1 and Z2 shown in FIG. 24. The lower mold base 340 is placed on a base not shown in the figure.

In this embodiment, a control unit 307 is employed for controlling the drive unit 303. The amount of descending movement (amount of displacement) of the upper mold 302 in accordance with the height of metal posts of the substrate 348 is set in the control unit 307. The metal mold 300 is also provided with a laser measurement unit 305 for measuring the height of the metal posts. The laser measurement unit 305 measures the height of each metal post of the substrate 348, and transmits detection signals carrying the data of the height of each metal post to the control unit 307. The upper mold 303 is thus moved down by a length in accordance with the metal post height data.

As shown in FIG. 24, a separation sheet (a second separation sheet) 344a closely contacts the cavity surface 302a and the dividing surface 302b of the upper mold 302. Another separation sheet (a first separation sheet) 344b also closely contacts the cavity surface 316a of the inner sub lower mold 316 and the dividing surface 318a of the outer sub lower mold 318. The substrate 348 provided with semiconductor chips having metal posts 346 is then placed in a position on the cavity surface 316a of the inner sub lower mold 316, with the metal posts 346 facing upward in FIG. 24. An encapsulating resin 350 is supplied on the substrate 348 placed on the cavity surface 316a.

Figure 25:
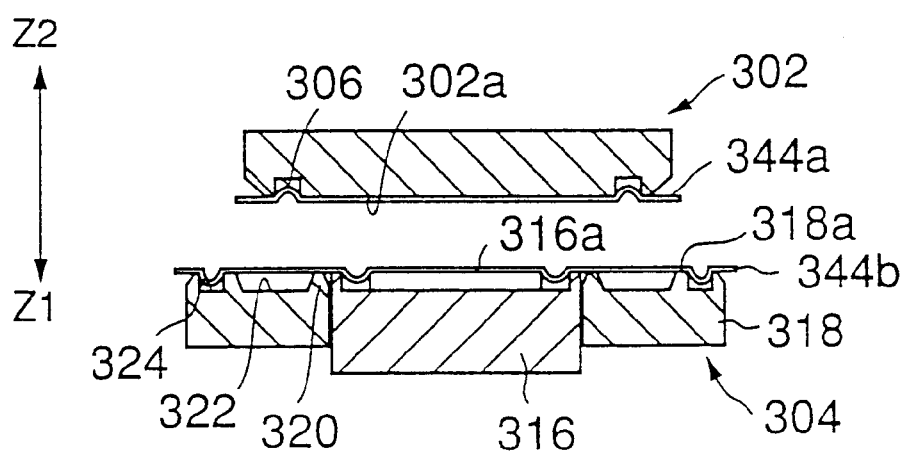
FIG. 25 is a sectional view partially showing the metal mold of the third embodiment at the beginning of a resin encapsulation process.

At the start of a resin encapsulation process, the upper mold 302 is held in a higher position, while the lower mold 304 has the dividing surface 318a of the outer sub lower mold 318 substantially on the same plane as the cavity surface 316a of the inner sub lower mold 316, as shown in FIG. 25.

In a separation sheet disposing process, the separation sheet 344a is placed on the cavity surface 302a and the dividing surface 302b of the upper mold 302, while the separation sheet 344b is placed on the cavity surface 316a of the inner sub lower mold 316 and the dividing surface 318b of the outer sub lower mold 318. The two separation sheets 344a and 344b in a tensed state are then attracted toward the suction grooves 310a to 310c and 334a to 334c, and are thus closely attached and fixed to the upper and lower molds 302 and 304. The separation sheets 344a and 344b are next attracted toward the suction grooves 308 and 332, and are thus drawn into the cavity portions 306 and 324 (i.e., the spaced portion). Here, the separation sheet 344b is not in contact with the dummy cavity 322.

Figure 26:
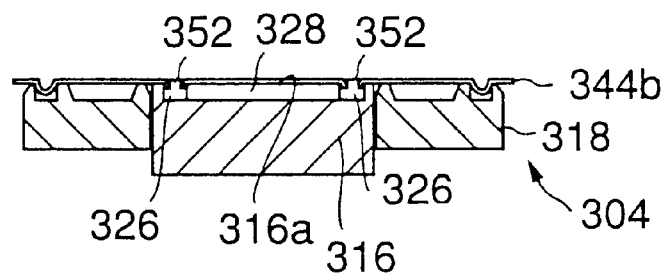
FIG. 26 is a sectional view partially showing the metal mold of the third embodiment when holes are formed in a separation sheet.

As shown in FIG. 26, the separation sheet 344b is attracted toward the suction grooves 326 and the groove portion 326, and is thus closely attached to the cavity surface 316a. Here, the separation sheet 344b is so strongly drawn toward the suction grooves 326 by a high vacuum that the separation sheet 344b is cut by the wall of each of the suction grooves 326. Thus, holes 352 can be easily and surely formed in predetermined positions in the separation sheet 344b.

Figure 27:
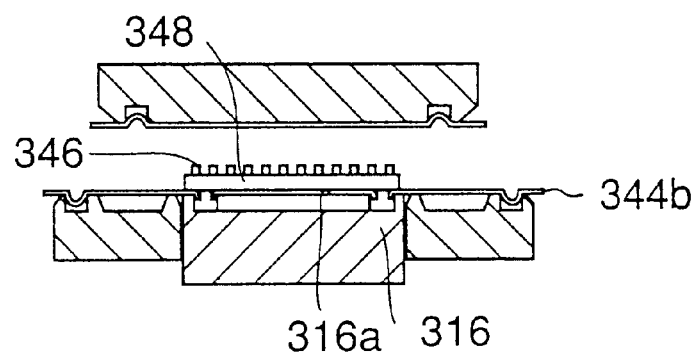
FIG. 27 is a sectional view partially showing the metal mold of the third embodiment when a substrate is placed.
Figure 28:
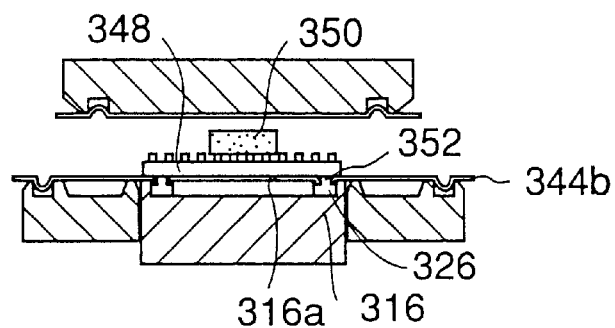
FIG. 28 is a sectional view partially showing the metal mold of the third embodiment when an encapsulation resin is supplied.

In a substrate disposing process, the substrate 348 provided with the metal posts 346 is placed in a predetermined position on the separation sheet 344b on the cavity surface 316a of the inner sub lower mold 316, with the metal posts 346 facing upward, as shown in FIG. 27. The encapsulation resin 350 is then disposed on the substrate 348, as shown in FIG. 28. The lower surface of the substrate 348 is attracted toward the suction grooves 326 via the holes 352 of the separation sheet 344b, so that the substrate 348 can be closely attached to the separation sheet 344b.

Figure 29:
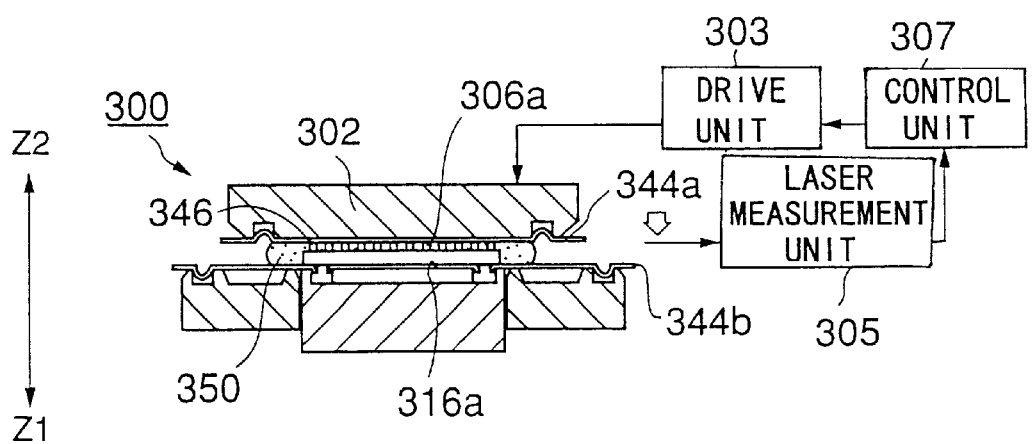
FIG. 29 is a sectional view partially showing the metal mold of the third embodiment when an upper mold is moved down.

Next in a resin layer forming process, the metal mold 300 is heated to a predetermined temperature, and the upper mold 302 is moved down in the direction of the arrow Z1, as shown in FIG. 29. At this point, the metal post height data obtained by the laser measurement unit 305 is sent to the control unit 307 to control the drive unit 303 in accordance with the heights of the metal posts 346. When the upper mold 302 is moved down to the point where the separation sheet 344a on the upper mold 302 reaches the top ends of the metal posts 346, the upper mold 302 comes to a halt. Thus, the melted encapsulation resin 350 is spread into the cavity formed between the cavity surfaces 302a and 316a, and the thickness of the encapsulation resin 350 is accurately controlled to conform to the top ends of the metal posts 346 or the lower surface of the separation sheet 344a.

Figure 30:
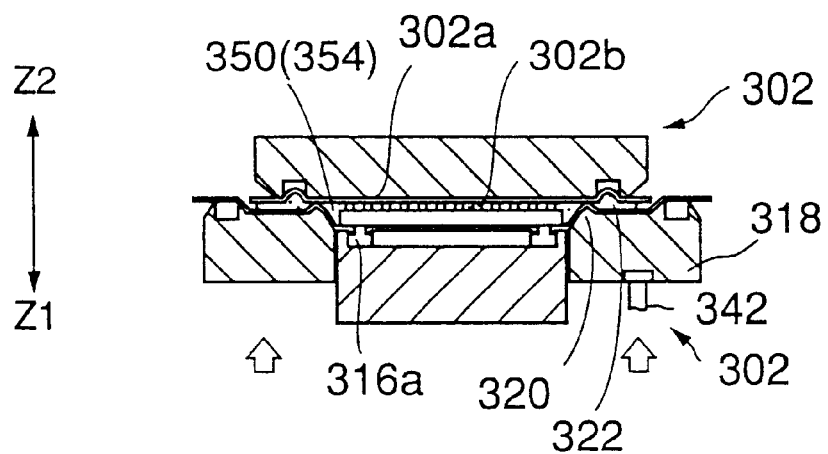
FIG. 30 is a sectional view partially showing the metal mold of the third embodiment when an outer sub lower mold is moved up.

As shown in FIG. 30, the cylinder 342 energizes the outer sub lower mold 318 to slide on the outer peripheral surface of the inner sub lower mold 316 in the direction of the arrow Z2. When the protruding portion 320 is substantially brought into contact with the cavity surface 302b, the outer sub lower mold 318 comes to a halt. Here, the cavity surfaces 302a and 316a form the cavity 354. After the cavity 354 is filled with the encapsulation resin 350, the excess resin 350' is evenly discharged into the dummy cavity 322 beyond the annular protruding portion 320. Even if the amount of the excess resin 350' exceeds the capacity of the dummy cavity 322, the excess resin 350' can be discharged through the opening of the dummy cavity 322. Thus, there is no risk of the excess resin 350' burying the top ends of the metal posts 346.

Figure 31:
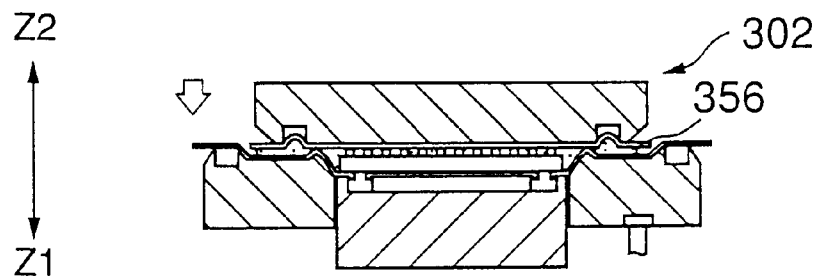
FIG. 31 is a sectional view partially showing the metal mold of the third embodiment when the upper mold is moved further down.
Figure 32:
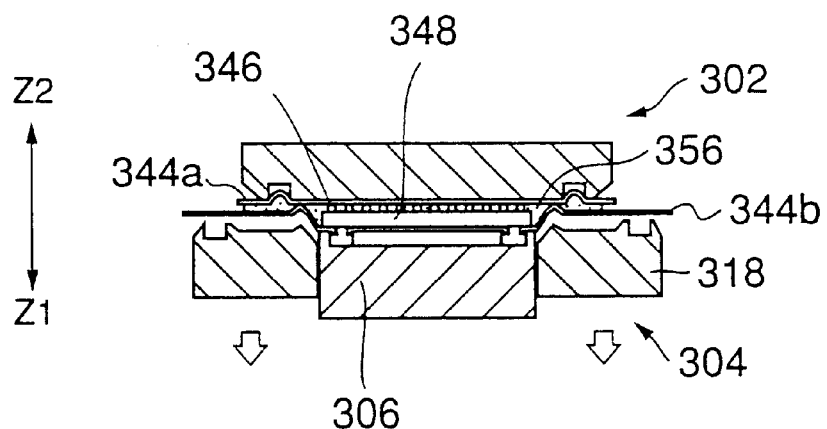
FIG. 32 is a sectional view partially showing the metal mold of the third embodiment when the outer sub lower mold is moved down.

As shown in FIG. 31, the upper mold 302 is moved down in the direction of the arrow Z1 until a desired pressure (molding pressure) is obtained. Thus, the top ends of the metal posts 346 are lodged in the separation sheet 344a. After a predetermined period of time, the encapsulation resin 350 solidifies to form a resin layer 356. The vacuum sources of the lower mold 304 are then stopped, and the outer sub lower mold 318 is moved in the direction of the arrow Z1, so that the cavity surface 316a is moved back in the initial position on the same plane as the dividing surface 318a. Here, the substrate 348 provided with the resin layer 356 remains on the inner sub lower mold 316, and the separation sheet 344b is removed from the dividing surface 318a.

Figure 33:
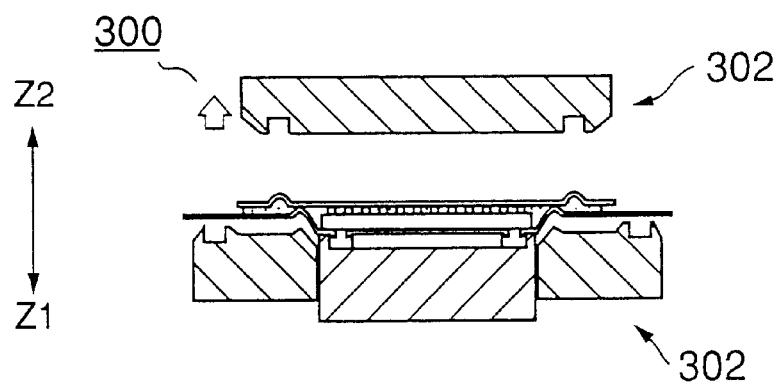
FIG. 33 is a sectional view partially showing the metal mold of the third embodiment when the upper mold is moved up.
Figure 34:
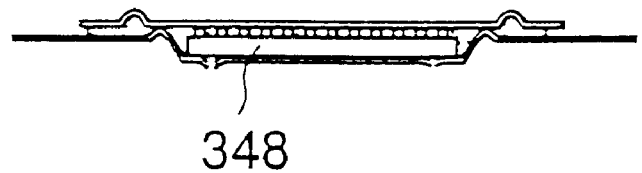
FIG. 34 shows the substrate taken out of the metal mold of the third embodiment after the resin encapsulation.
Figure 35:
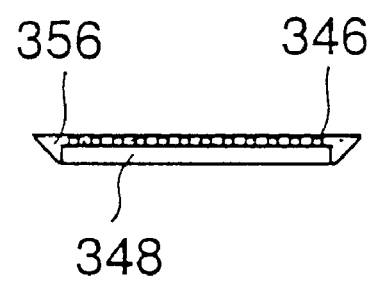
FIG. 35 shows the substrate in a trimmed state.

Next in a substrate taking out process, the upper mold 302 is moved up to open the metal mold 300, as shown in FIG. 33. The substrate 348 is then taken out from the metal mold 300, as shown in FIG. 34. The separation sheets 344a and 344b are removed from the substrate 348, as shown in FIG. 35, leaving the top ends of the metal posts 346 being exposed from the resin layer 356. The substrate 348 is trimmed to remove the unnecessary portion of the resin layer 356, and the resin encapsulation of the substrate 348 is thus completed. As in the first embodiment, the substrate 348 is then divided into semiconductor devices.

Referring now to FIGS. 36 to 46, a method of producing semiconductor devices and a metal mold for producing semiconductor devices in accordance with a fourth embodiment of the present invention will be described below.

Figure 36:
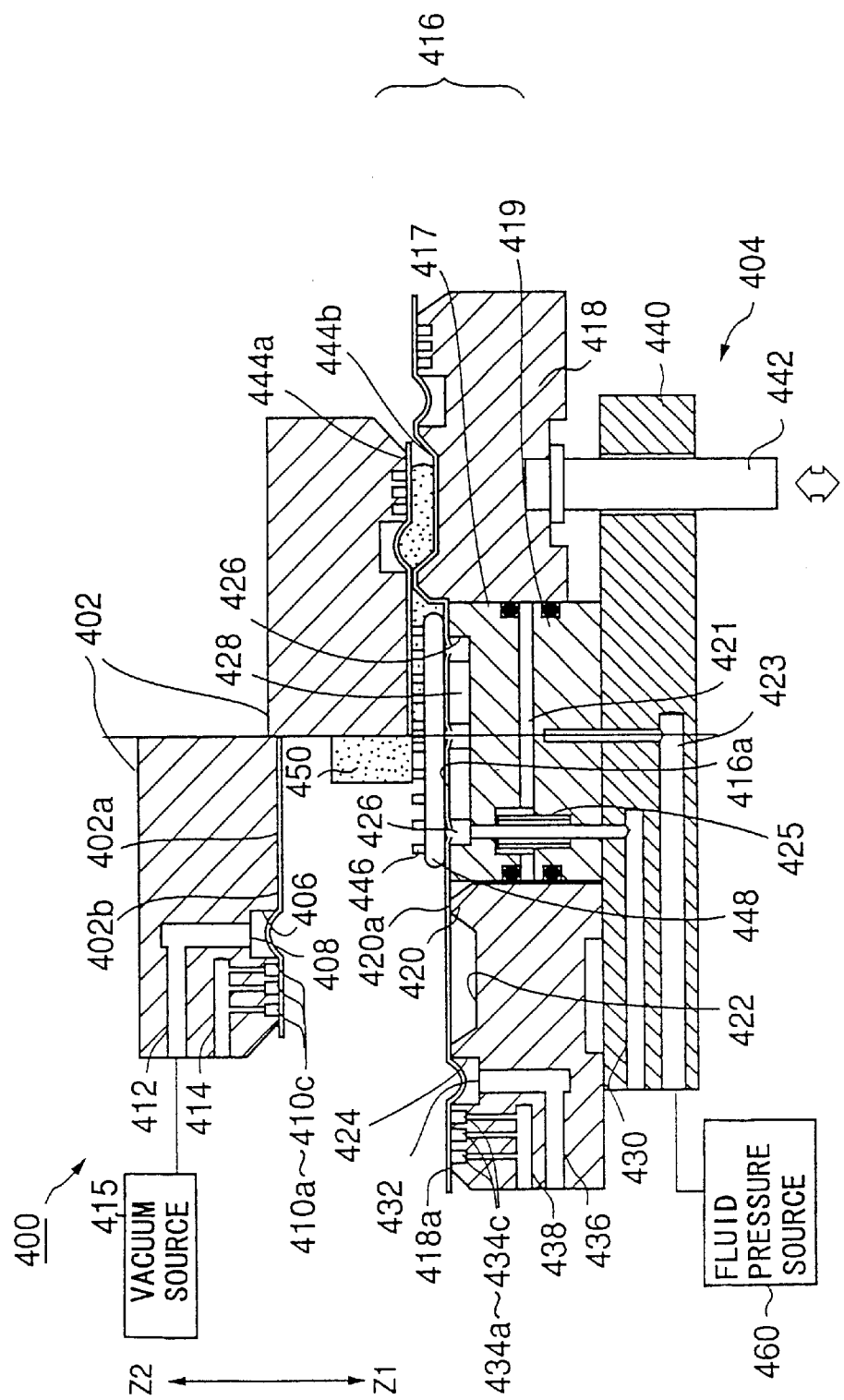
FIG. 36 is a front sectional view of a metal mold for producing semiconductor devices of a fourth embodiment of the present invention.

In FIG. 36, the left half defined by a vertical center line shows a metal mold 400 in an opened state, the right half shows the metal mold 400 in a closed state. The metal mold 400 basically has the same structure as the metal mold 300 of the third embodiment, except that the inner sub lower mold of the metal mold 400 is movable.

The metal mold 400 is a dividable metal mold, comprising an upper mold (a second metal mold) 402 and a lower mold (a first metal mold) 404. The metal mold 400 is provided with a heating source not shown in the drawings.

The lower surface of the upper mold 402 includes a flat cavity surface (a second cavity forming surface) 402a having substantially the same size and shape as a substrate 448. A dividing surface 402b extends from the outer periphery of the cavity surface 402a. The dividing surface 402b is provided with an annular cavity portion 406. The dividing surface 402b including the cavity surface 402a is entirely flat. An annular suction groove (a second suction portion or a second suction groove) 408 is formed in the bottom surface (a dividing surface) of the cavity portion 406, and annular suction grooves (first suction portions or first suction grooves) 410a to 410c are further formed in the outer portion of the dividing surface 402b outside the cavity portion 406. These suction grooves 408 and 410a to 410c are connected to independently controllable vacuum sources via communication channels 412 and 414. In FIG. 36, only a vacuum source 415 connected to the communication channel 412 is shown. The upper mold 402 is energized by a drive unit (not shown), and is movable in directions of arrows Z1 and Z2 shown in FIG. 36.

The lower mold 404 comprises an inner sub lower mold (a first movable sub metal mold) 416 and an outer sub lower mold (a second movable sub metal mold) 418 surrounding the inner sub lower mold 416. The upper surface of the inner sub lower mold 416 includes a flat cavity surface (a first cavity forming surface) 416a having substantially the same size and shape as the substrate 448. A dividing surface 418a is formed on the upper surface of the outer sub lower surface 418. The dividing surface 418a is provided with a protruding portion 420 having narrow flat end portions 420a along the outer periphery of the cavity surface 416a. Also, an annular concave portion 422 which serves as a dummy cavity for accommodating excess resin is formed outside the protruding portion 420. Another concave portion 424 is formed outside the dummy cavity 422. The upper mold 402 has a smaller diameter than the lower mold 404 as in the third embodiment. As a result, the concave portion 424 is not situated in a position corresponding to the concave portion 406. Instead, the dummy cavity 422 is situated in the position corresponding to the concave portion 406. Accordingly, the dummy cavity 422 has an outwardly opening portion. Also, the concave portions 406 and 424 constitute a spaced portion for providing tension to the separation sheets.

The cavity surface 416a of the inner sub lower mold 416 is provided with suction grooves (third suction portions or third suction grooves) 426 and a groove portion 428 which are the same as the suction grooves 326 and the groove portion 328 of the third embodiment. The suction grooves 426 and the groove portion 428 are connected to an independently controllable vacuum source (not shown) via a communication channel 430.

Another annular suction groove (a second suction portion or a second suction groove) 432 is formed in the bottom surface (a dividing surface) of the cavity portion 424 of the outer sub lower mold 418. Annular suction grooves (first suction portions or first suction grooves) 434a to 434c are further formed in the outer portion of the dividing surface 418b outside the cavity portion 424. These suction grooves 432 and 434a to 434c are connected to independently controllable vacuum sources via communication channels 436 and 438.

The inner sub lower mold 416 comprises an upper movable sub mold 417 having the cavity surface 416a and a lower fixed sub mold 419 fixed onto a lower mold base 440. A fluid chamber 421 is formed between the upper movable sub mold 417 and the lower fixed sub mold 419. The fluid chamber 421 is connected to a fluid pressure source 460 as a drive source via a communication channel 423. Accordingly, the upper movable sub mold 417 can be evenly moved up and down in the directions of the arrows Z1 and Z2 by a fluid pressure from a fluid pressure source 460. The communication channel 430 communicates with a pipe 425 penetrating the fluid chamber 421, and the upper movable sub mold 417 is slidably in contact with the pipe 425. Meanwhile, the lower surface of the outer sub lower mold 418 is attached to an end portion of a cylinder 442 penetrating through the lower mold base 440. This cylinder 442 energizes the outer sub lower mold 418 to slide on the outer peripheral surface of the inner sub lower mold 416 via a slide member (not shown) in the directions of the arrows Z1 and Z2. The lower mold base 440 is placed on a base not shown in the figure.

As shown in FIG. 36, a separation sheet (a second separation sheet) 444a closely contacts the cavity surface 402a and the dividing surface 402b of the upper mold 402. Another separation sheet (a first separation sheet) 444b also closely contacts the cavity surface 416a of the inner sub lower mold 416 and the dividing surface 418a of the outer sub lower mold 418. The substrate 448 provided with semiconductor chips having metal posts 446 is then placed in a predetermined position on the cavity surface 416a of the inner sub lower mold 416, with the metal posts 446 facing upward as shown in FIG. 36. An encapsulating resin 450 is supplied on the substrate 448 placed on the cavity surface 416a.

Figure 37:
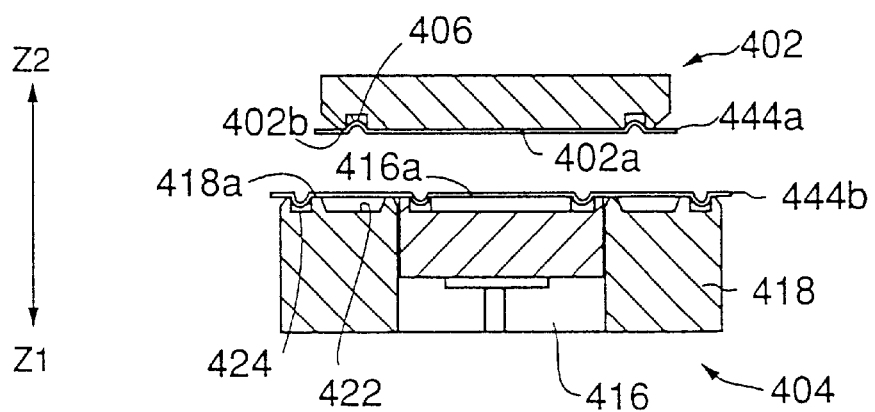
FIG. 37 is a sectional view partially showing the metal mold of the fourth embodiment at the beginning of a resin encapsulation process.

At the start of a resin encapsulation process, the upper mold 402 is held in a higher position, as shown in FIG. 37. As for the lower mold 404, the outer sub lower mold 418 and the upper movable sub mold 417 of the inner lower sub mold 416 are both pushed downward, and the dividing surface 418a of the outer sub lower mold 418 and the cavity surface 416a of the inner sub lower mold 416 are maintained on the same plane.

In a separation sheet disposing process, the separation sheet 444a is placed on the cavity surface 402a and the dividing surface 402b of the upper mold 402, while the separation sheet 444b is placed on the cavity surface 416a of the inner sub lower mold 416 and the dividing surface 418b of the outer sub lower mold 418. The two separation sheets 444a and 444b in a tensed state are then attracted toward the suction grooves 410a to 410c and 434a to 434c, and are thus closely attached and fixed to the upper and lower molds 402 and 404. The separation sheets 444a and 444b are next attracted toward the suction grooves 408 and 432, and are thus drawn into the cavity portions 406 and 424 (i.e., a spaced portion). Here, the separation sheet 444b is not in contact with the dummy cavity 422.

Figure 38:
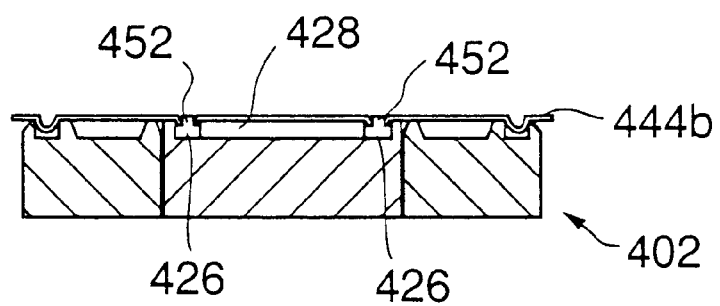
FIG. 38 is a sectional view partially showing the metal mold of the fourth embodiment when holes are formed in a separation sheet.

As shown in FIG. 38, the separation sheet 444b is attracted toward the suction grooves 426 and the groove portion 426, and is thus closely attached to the cavity surface 416a. Here, the separation sheet 444b is so strongly drawn toward the suction grooves 426 by a high vacuum that the separation sheet 444b is cut by the wall of each of the suction grooves 426. Thus, holes 452 can be easily and surely formed in predetermined positions in the separation sheet 444b.

Figure 39:
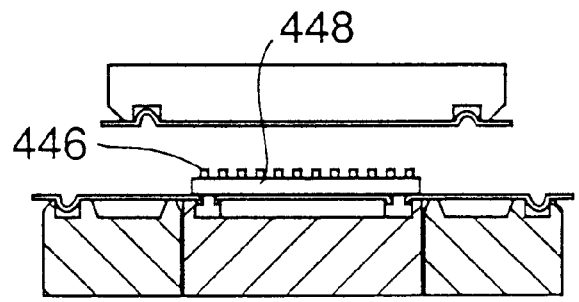
FIG. 39 is a sectional view partially showing the metal mold of the fourth embodiment when a substrate is placed.
Figure 40:
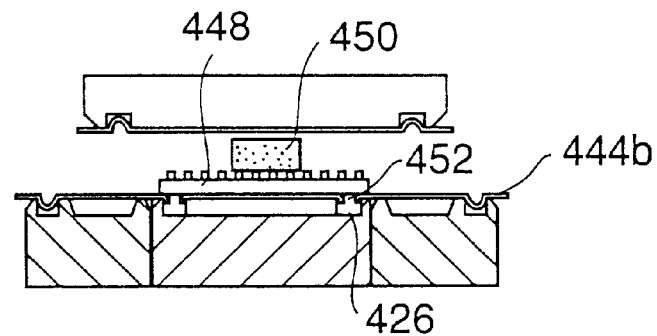
FIG. 40 is a sectional view partially showing the metal mold of the fourth embodiment when an encapsulation resin is supplied.

In a substrate disposing process, the substrate 448 provided with the metal posts 446 is placed in a predetermined position on the separation sheet 444b on the cavity surface 416a of the inner sub lower mold 416, with the metal posts 446 facing upward, as shown in FIG. 39. The encapsulation resin 450 is then disposed on the substrate 448, as shown in FIG. 40. The lower surface of the substrate 448 is attracted toward the suction grooves 426 via the holes 452 of the separation sheet 444b, so that the substrate 448 can be closely attached to the separation sheet 444b.

Figure 41:
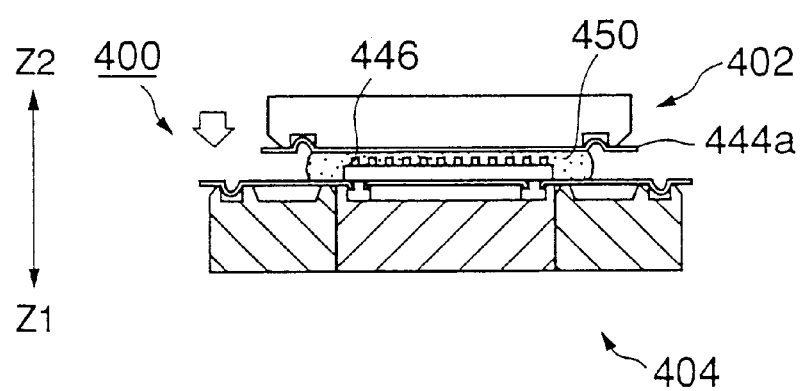
FIG. 41 is a sectional view partially showing the metal mold of the fourth embodiment when an upper mold is moved down.

Next in a resin layer forming process, the metal mold 400 is heated to a predetermined temperature, and the upper mold 402 is moved down in the direction of the arrow Z1, as shown in FIG. 41. When the upper mold 402 is moved down to the point where the separation sheet 444a on the upper mold 402 reaches the top ends of the metal posts 446, the upper mold 402 comes to a halt. Thus, the melted encapsulation resin 450 is spread into the cavity formed between the cavity surfaces 402a and 416a, and the top ends of the metal posts 446 are covered with the encapsulation resin 450.

Figure 42:
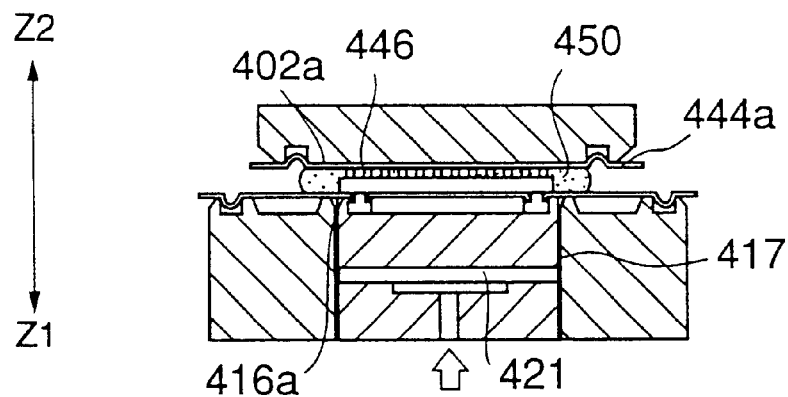
FIG. 42 is a sectional view partially showing the metal mold of the fourth embodiment when an inner sub lower mold is moved up.

As shown in FIG. 42, the upper movable sub mold 417 moves up in the direction of the arrow Z2 via the fluid chamber 421 by virtue of the fluid pressure from the fluid pressure source 460. When the top ends of the metal posts 446 is brought into contact with the separation sheet 444a to obtain a predetermined fluid pressure, the upper movable sub mold 417 comes to a halt. Since the upper movable sub mold 417 evenly moves up, the top ends of the metal posts 446 are also evenly brought into contact with the separation sheet 444a.

Figure 43:
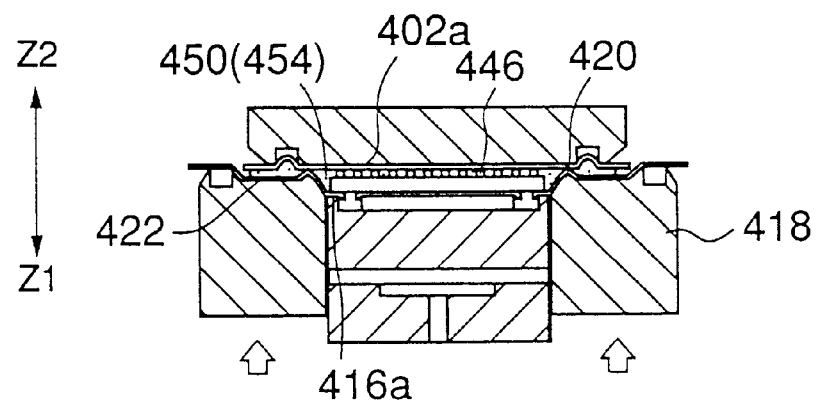
FIG. 43 is a sectional view partially showing the metal mold of the fourth embodiment when an outer sub lower mold is moved up.

As shown in FIG. 43, the outer lower sub mold 418 is moved up in the direction of the arrow Z2, so that the protruding portion 420 is brought into contact with the cavity surface 402b. Here, the cavity surfaces 402a and 416a form the cavity 454. After the cavity 454 is filled with the encapsulation resin 450, the excess resin 450' is evenly discharged into the dummy cavity 422 beyond the annular protruding portion 420. Even if the amount of the excess resin 450' exceeds the capacity of the dummy cavity 422, the excess resin 450' can be discharged through the opening of the dummy cavity 422. Thus, there is no risk of the excess resin 450' burying the top ends of the metal posts 446.

Figure 44:
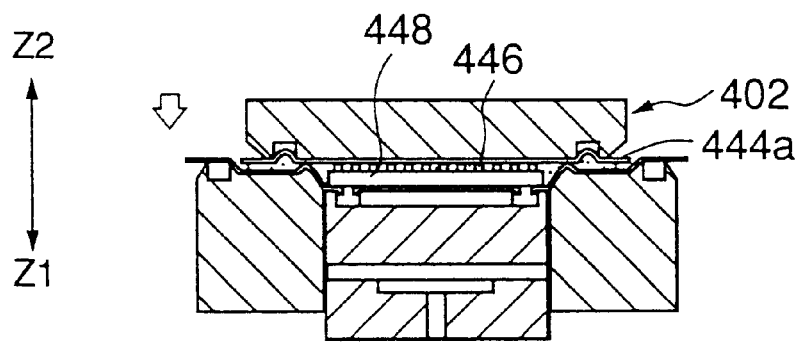
FIG. 44 is a sectional view partially showing the metal mold of the fourth embodiment when the upper mold is moved further down.
Figure 45:
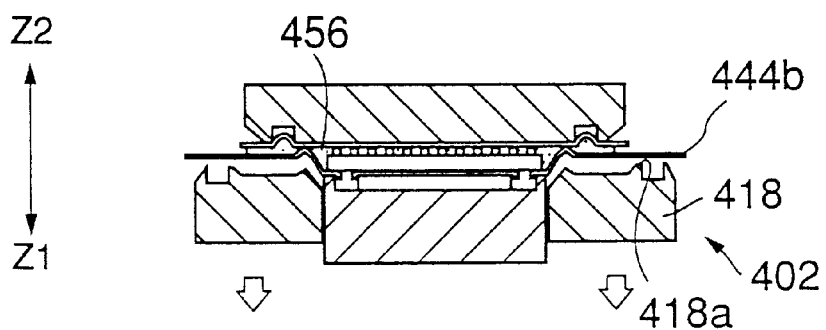
FIG. 45 is a sectional view partially showing the metal mold of the fourth embodiment when the outer sub lower mold is moved down.

As shown in FIG. 44, the upper mold 402 is moved down in the direction of the arrow Z1 until a desired pressure (molding pressure) is obtained. Thus, the top ends of the metal posts 446 are lodged in the separation sheet 444a. After a predetermined period of time, the encapsulation resin 450 solidifies to form a resin layer 456.

Next in a substrate taking out process, the vacuum sources of the lower mold 404 are stopped, and the outer sub lower mold 418 is moved in the direction of the arrow Z1, so that the cavity surface 416a is moved back in the initial position on the same plane as the dividing surface 418a. Here, the substrate 448 provided with the resin layer 456 remains on the inner sub lower mold 416, and the separation sheet 444b is removed from the dividing surface 418a.

Figure 46:
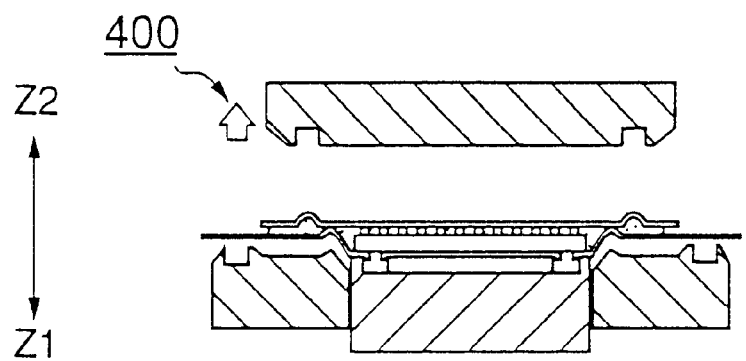
FIG. 46 is a sectional view partially showing the metal mold of the fourth embodiment when the upper mold is moved up.

As shown in FIG. 46, the upper mold 402 is moved up to open the metal mold 400. The substrate 448 is then taken out from the metal mold 400, and the separation sheets 444a and 444b are removed from the substrate 448. Here, the top ends of the metal posts 446 are exposed from the resin layer 456. The substrate 448 is then trimmed to remove the unnecessary portion of the resin layer 456, and the resin encapsulation of the substrate 448 is thus completed. As in the first embodiment, the substrate 448 is then divided into semiconductor devices.

The present invention is not limited to the specifically disclosed embodiments, but variations and modifications may be made without departing from the scope of the present invention.

The present application is based on Japanese priority application No. 11-180258, filed on Jun. 25, 1999, the entire contents of which are hereby incorporated by reference.

What is claimed is:

1. A method of producing semiconductor devices, comprising the steps of:

opening a dividable metal mold which comprises a first metal mold having a first cavity forming surface and a second metal mold having a second cavity forming surface, the first metal mold having a first surface facing the second metal mold while the second metal mold having a second surface facing the first metal mold;

disposing a first separation sheet on the first surface including the first cavity forming surface, and a second separation sheet on the second surface including the second cavity forming surface;

attaching the first separation sheet and the second separation sheet closely to the first cavity forming surface and the second cavity forming surface by attracting the first separation sheet and the second separation sheet via a plurality of annular suction portions formed in the respective dividing surfaces;

placing a substrate provided with a plurality of semiconductor chips on the first separation sheet on the first cavity forming surface;

placing a resin piece on said substrate;

closing the dividable metal mold so as to form a resin layer by a compression molding technique by using said resin piece provided on the substrate such that a molten resin layer covers a surface of said substrate, said step of closing the dividable metal mold including the step of causing to flow an excess resin out of a cavity formed by said first cavity forming surface and said second cavity forming surface along a path formed between said first separation sheet and said second separation sheet;

opening the dividable metal mold so as to remove the substrate having the resin layer formed thereon from the dividable metal mold;

removing the first separation sheet and the second separation sheet from the substrate; and dividing the substrate into individual semiconductor devices.

2. The method as claimed in claim 1, wherein:

the first separation sheet and the second separation sheet are closely attached to the dividing surfaces by a vacuum source through first suction portions formed along outer peripheries of the first cavity forming surface and the second cavity forming surface, the first suction portions being included in the plurality of annular suction portions; and the first separation sheet and the second separation sheet are tensioned by vacuum sources through second suction portions disposed in a space formed between the first suction portion and the first and second cavity forming portions.

3. The method as claimed in claim 1, wherein:

the first cavity forming surface is provided with third suction portions for attracting the first separation sheet toward the first cavity forming surface by suction; and the step of placing the substrate comprises the steps of:

forming holes in positions in the first separation sheet corresponding to the positions of he third suction portions in the first cavity forming surface by a vacuum pressure applied from a vacuum source via the third suction portions; and attaching the substrate closely to the first separation sheet and the first cavity forming surface by the vacuum pressures via the holes and the third suction portions.

4. The method as claimed in claim 1, wherein:

a dummy cavity for accommodating excess resin is formed along outer peripheries of the first and second cavity forming surfaces of the first and second metal mold;

a protruding portion is formed on at least one of the dividing surfaces of the first and second metal molds so that an opening is formed between a cavity defined by the first and second cavity forming surfaces and the dummy cavity when the dividable metal mold is closed; and the step of forming the resin layer includes the step of discharging excess resin from the encapsulation resin into the dummy cavity via the narrow portion.

5. The method as claimed in claim 1, wherein:

the substrate is provided with electrodes protruding from a surface thereof;

the first metal mold comprises a first movable sub metal mold having the first cavity forming surface and a second movable sub metal mold surrounding the first movable sub metal mold and having a dividing surface along the outer periphery of the first cavity forming surface; and the step of forming the resin layer includes the steps of:

moving the second metal mold so that the second separation sheet closely attached to the second cavity forming surface comes to the vicinity of top ends of the electrodes;

moving the substrate by moving the first movable sub metal mold so that the second separation sheet closely attached to the second metal mold is brought into contact with the top ends of the electrodes;

forming a cavity by moving the second movable sub metal mold;

discharging an excessive amount of the encapsulation resin into a dummy cavity formed along an outer periphery of the cavity; and applying a molding pressure to the encapsulation resin by further moving the second metal mold.

6. The method as claimed in claim 1, wherein:

the substrate is provided with electrodes protruding from a surface thereof;

the second metal mold is moved toward the first metal mold by means of a drive unit, thereby performing compression molding; and the step of forming the resin layer includes the step of controlling, movement of the second metal mold to stop when the second metal mold is brought into contact with the electrodes formed on the substrate.

7. The method as claimed in claim 6, wherein the step of controlling the movement of the second metal mold includes the steps of:

measuring a height of each of the electrodes after the substrate is placed on the first metal mold; and inputting measured height data of the electrodes into the drive unit to move the second metal mold as desired.

* * * * *